(12) United States Patent
Li et al.

(10) Patent No.: US 11,740,297 B2
(45) Date of Patent: Aug. 29, 2023

(54) METHODS AND SYSTEMS FOR DIAGNOSIS OF FAILURE MECHANISMS AND FOR PREDICTION OF LIFETIME OF METAL BATTERIES

(71) Applicant: Battelle Energy Alliance, LLC, Idaho Falls, ID (US)

(72) Inventors: Bin Li, Idaho Falls, ID (US); Eric J. Dufek, Ammon, ID (US); Ningshengjie Gao, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 160 days.

(21) Appl. No.: 17/249,158

(22) Filed: Feb. 22, 2021

(65) Prior Publication Data
US 2021/0263108 A1    Aug. 26, 2021

Related U.S. Application Data

(60) Provisional application No. 62/981,433, filed on Feb. 25, 2020.

(51) Int. Cl.
*G01R 31/392*   (2019.01)
*H01M 10/48*    (2006.01)

(52) U.S. Cl.
CPC ........ *G01R 31/392* (2019.01); *H01M 10/488* (2013.01)

(58) Field of Classification Search
None
See application file for complete search history.

(56) References Cited

U.S. PATENT DOCUMENTS 11,255,918 B2 *   2/2022   Desai ................. G01R 31/367
2016/0259014 A1 *  9/2016   Adagouda Patil ... G01R 31/392

OTHER PUBLICATIONS

Abboud et al., Communication—Implications of Local Current Density Variations on Lithium Plating Affected by Cathode Particle Size, Journal of the Electrochemical Society, vol. 166, No. 4, (Mar. 2, 2019), pp. A667-A669.

(Continued)

*Primary Examiner* — Roy Y Yi
(74) *Attorney, Agent, or Firm* — TraskBritt

(57) ABSTRACT

Methods for diagnosing failure mechanisms and for predicting lifetime of metal batteries include monitoring rest voltage and Coulombic Efficiency over relatively few cycles to provide profiles that indicate, by the trends thereof, a particular failure mechanism (e.g., electrolyte depletion, loss of metal inventory, increased cell impedance). The methods also include cycling over relatively few cycles an anode-free cell, having the same cathode and electrolyte as the metal battery, but with a current collector instead of the anode. Discharge capacity is monitored and profiled, and a discharge capacity curve is fitted to the discharge capacity profile to discern a capacity retention per cycle. The lifetime of the metal battery is determined using the capacity retention per cycle discerned from the anode-free cell. Related systems include a metal-based battery and an anode-free cell or a battery cell reconfigurable between a metal-based and an anode-free cell.

20 Claims, 13 Drawing Sheets

(56) References Cited

OTHER PUBLICATIONS

Anonymous, Battery500 Consortium to Spark EV Innovations: Pacific Northwest National Laboratory-led, 5-year Dollar50M effort seeks to almost triple energy stored in electric car batteries, Office of Technology Transitions, (Jul. 28, 2016), available online at https://www.energy.gov/technologytransitions/articles/battery500-consortium-spark-ev-innovations-pacific-northwest-national.

Borup et al., Scientific Aspects of Polymer Electrolyte Fuel Cell Durability and Degradation, Chem. Rev., vol. 107, (2007), pp. 3904-3951.

Broussely et al., Main aging mechanisms in Li ion batteries, Journal of Power Sources, vol. 146, (May 31, 2005), pp. 90-96.

Buchmann, Isidor, What Causes Lithium-ion to Die, Battery University, (last updated Sep. 22, 2014), available online at https://batteryuniversity.com/learn/article/what_causes_lithium_ion_to_die, 8 pages.

Cao et al., Monolithic Solid-electrolyte Interphases Formed in Fluorinated Orthoformate-based Electrolytes Minimize Li Depletion and Pulverization, Nature Energy, vol. 4, (2019), pp. 796-805.

Chen et al., Critical Parameters for Evaluating Coin Cells and Pouch Cells of Rechargeable Li-Metal Batteries, Joule, vol. 3, (Apr. 17, 2019), pp. 1094-1105.

Chen et al., Dead lithium: mass transport effects on voltage, capacity, and failure of lithium metal anodes, Journal of Materials Chemistry A, (Mar. 2017), 12 pages.

Cheng et al., Toward Safe Lithium Metal Anode in Rechargeable Batteries: A Review, Chem. Rev., vol. 117, (2017), pp. 10403-10473.

Dubarry et al., Evaluation of commerical lithium-ion cells based on composite positive electrode for plug-in hybrid electric vehicle applications. Part II. Degradation mechanism under 2 C cycle aging, Journal of Power Sources, vol. 196, (2011), pp. 10336-10343.

Fang et al., Quantifying Inactive Lithium in Lithium Metal Batteries, Nature, vol. 572, (Aug. 2019), pp. 511-515.

Goa et al., Fast Diagnosis of Failure Mechanisms and Lifetime Prediction of Li Metal Batteries, Small Methods, (Nov. 3, 2020), 11 pages.

Hutzenlaub et al., Three-dimensional electrochemical Li-ion battery modelling featuring a focused ion-beam/scanning electron microscopy based three-phase reconstruction of a LiCoO2 cathode, Electrochimica Acta, vol. 115, (2014), pp. 131-139.

Jungst et al., Accelerated calendar and pulse life analysis of lithium-ion cells, Journal of Power Sources, vol. 119-121, (Jun. 2003), pp. 870-873.

Kim et al., Correlation of electrochemical and mechanical responses: Differential analysis of rechargeable lithium metal cells, Journal of Power Sources, vol. 463, (2020), 228180 pages.

Kong et al., Gas evolution behaviors for several cathode materials in lithium-ion batteries, Journal of Power Sources, vol. 142, (2005), pp. 285-291.

Lee et al., Electrode Edge Effects and Failure Mechanism of Lithium Metal Batteries, ChemSusChem., vol. 11, No. 21, (Nov. 2018), pp. 3821-3828.

Lin et al., Reviving the lithium metal anode for high-energy batteries, Nature Nanotechnology, vol. 12, (Mar. 2017), pp. 194-206.

Liu et al., Pathways for practical high-energy long-cycling lithium metal batteries, Nature Energy, vol. 4, No. 3, (Mar. 2019), pp. 180-186.

Lu et al., A review on the key issues for lithium-ion battery management in electric vehicles, Journal of Power Sources, vol. 226, (2013), pp. 272-288.

Märker et al., Evolution of structure and lithium dynamics in LiNi0.8Mn0.1Co0.102(NMC811) cathodes during electrochemical cycling, Chem. Mater., vol. 31, No. 7, (2019), pp. 2545-2554.

Momidi et al., Understanding Solid Electrolyte Interface (SEI) to Improve Lithium Ion Battery Performance, Nov. 1, 2019, available online at https://circuitdigest.com/article/what-is-solid-electrolyte-interface-sei-to-improve-lithium-ion-battery-performance [Feb. 4, 2020 10:15:11 PM], 15 pages.

Nagpure et al., Impacts of lean electrolyte on cycle life for rechargeable Li metal batteries, Journal of Power Sources, vol. 407, (2018), pp. 53-62.

Noh et al., Comparison of the structural and electrochemical properties of layered Li[NixCoyMnz]O2 (x ⅓, 0.5, 0.6, 0.7, 0.8 and 0.85) cathode material for lithium-ion batteries, Journal of Power Sources, vol. 233, (2013), pp. 121-130.

Parekh et al., Controlling dendrite growth in lithium metal batteries through forced advection, Journal of Power Sources, vol. 452, (Mar. 2020), 227760, 6 pages.

Ren et al., Enabling High-Voltage Lithium-Metal Batteries under Practical Conditions, Joule, vol. 3, No. 7, (Jul. 17, 2019), pp. 1662-1676.

Self et al., Survey of Gas Expansion in Li-Ion NMC Pouch Cells, Journal of the Electrochemical Society, vol. 162, No. 6, (2015), pp. A796-A802.

Shi et al., Accelerated Lifetime Testing of Organic-Inorganic Perovskite Solar Cells Encapsulated by Polyisobutylene, ACS Appl. Mater. Interfaces, vol. 9, No. 30, (2017), pp. 25073-25081.

Troltzsch et al., Characterizing aging effects of lithium ion batteries by impedance spectroscopy Electrochimica Acta, vol. 51, (2006), pp. 1664-1672.

Wood et al., Lithium Metal Anodes: Toward an Improved Understanding of Coupled Morphological Electrochemical, and Mechanical Behavior, ACS Energy Lett., vol. 2, (2017), pp. 664-672.

Wood et al., Predicting Calendar Aging in Lithium Metal Secondary Batteries: The Impacts of Solid Electrolyte Interphase Composition and Stability, Adv. Energy Mater., vol. 8, No. 26, (Sep. 14, 2018), pp. 1801427.

Xiao et al., Understanding and applying coulombic efficiency in lithium metal batteries, Nature Energy vol. 5, (Aug. 2020), pp. 561-568.

Zhang etal., A Quantitative Failure Analysis on Capacity Fade in Rechargeable Lithium Metal Cells, Journal of the Electrochemical Society, vol. 167, (2020), pp. 090502.

* cited by examiner

US 11,740,297 B2

METHODS AND SYSTEMS FOR DIAGNOSIS OF FAILURE MECHANISMS AND FOR PREDICTION OF LIFETIME OF METAL BATTERIES

CROSS-REFERENCE TO RELATED APPLICATION

This application claims the benefit, under 35 U.S.C. § 119(e), of U.S. Provisional Patent Application Ser. No. 62/981,433, filed Feb. 25, 2020, the disclosure of which is hereby incorporated in its entirety herein by this reference.

STATEMENT REGARDING FEDERALLY SPONSORED RESEARCH OR DEVELOPMENT

This invention was made with government support under Contract No. DE-AC07-05-ID14517 awarded by the United States Department of Energy. The government has certain rights in the invention.

TECHNICAL FIELD

The disclosure, in various embodiments, relates generally to the testing and design of metal batteries (e.g., lithium metal batteries). More particularly, this disclosure relates to methods and systems for diagnosing failure mechanisms of metal batteries and for predicting the lifetime of the metal batteries.

BACKGROUND

Currently, rechargeable lithium-ion batteries have conquered the market and powered most portable electronic and optoelectronic devices throughout the world. Such "Li-ion" batteries have, therefore, become commonly used in daily life. However, their further commercial uptake in the field of, e.g., electric vehicles remains hampered by the high cost and low energy density of conventional Li-ion batteries. Therefore, significant improvements to Li-ion batteries, in terms of energy density and cost, are of significant interest. To achieve mass market penetration, a goal of the U.S. Department of Energy is to develop a battery pack with a cell level specific energy of 500 W·h/kg, which battery back will provide a smaller, lighter, and less expensive vehicle battery compared to prior, conventional Li-ion battery packs.

BRIEF SUMMARY

In some embodiments, disclosed is a method for analyzing operation of a metal-based battery cell. The method comprises providing a metal-based battery cell comprising a cathode, an anode, and an electrolyte between the cathode and the anode. The metal-based battery cell is cycled. Over the cycling, a rest voltage and Coulombic efficiency (CE) of the cell are measured, without conducting additional testing, to provide rest voltage and CE profiles that indicate, by trends indicated therein, at least one of an increased cell impedance failure mechanism, a loss of metal inventory failure mechanism, or an electrolyte depletion failure mechanism. The method also includes providing an anode-free battery cell comprising the cathode, a current collector, and the electrolyte between the cathode and the current collector. The anode-free battery cell does not comprise the anode of the metal-based battery cell. The anode-free battery cell is cycled over fewer than about 100 cycles. Over those fewer than about 100 cycles, a discharge capacity of the anode-free battery cell is measured. A discharge capacity curve is fit to the measured discharge capacity to discern a capacity retention per cycle of the anode-free battery cell. Based in part on the capacity retention per cycle discerned from the anode-free battery cell, and without measuring discharge capacities of the metal-based battery cell directly, a cycle life of the metal-based battery cell is predicted.

In some embodiments, a system—for diagnosing failure mechanisms and for predicting a cycle life of a metal-based battery cell—comprises a metal-based battery cell comprising a cathode, an anode, an electrolyte between the cathode and the anode. The system also comprises an anode-free cell comprising another of the cathode, a current collector, and another of the electrolyte between the cathode and the current collector. The anode comprises a metal. The current collector of the anode-free cell comprises another metal different from the metal of the anode of the metal-based battery cell.

In some embodiments, a system—for diagnosing failure mechanisms and for predicting a cycle life of a metal-based battery cell—comprises at least one battery cell comprising a cathode, and an electrolyte. The at least one battery cell also comprises either an anode or a current collector. The anode is selectively removable to replace the anode with the current collector. The current collector is selectively removable to replace the current collector with the anode.

BRIEF DESCRIPTION OF THE DRAWINGS

FIG. 6G shows a discharge capacity and CE profile for a described example of the Li∥NMC cell (metal battery cell), and its corresponding rest voltage profile is shown in FIG. 6H.

FIGS. 7A through 7C are diagrams for predicting lifetime using rest voltage and CE, wherein FIG. 7A shows a CE and rest voltage profile indicating an increased impedance failure mechanism, FIG. 7B shows a CE and rest voltage profile indicating a loss of Li inventory failure mechanism, and FIG. 7C shows a CE and rest voltage profile indicating an electrolyte depletion failure mechanism.

DETAILED DESCRIPTION

Figure 1:
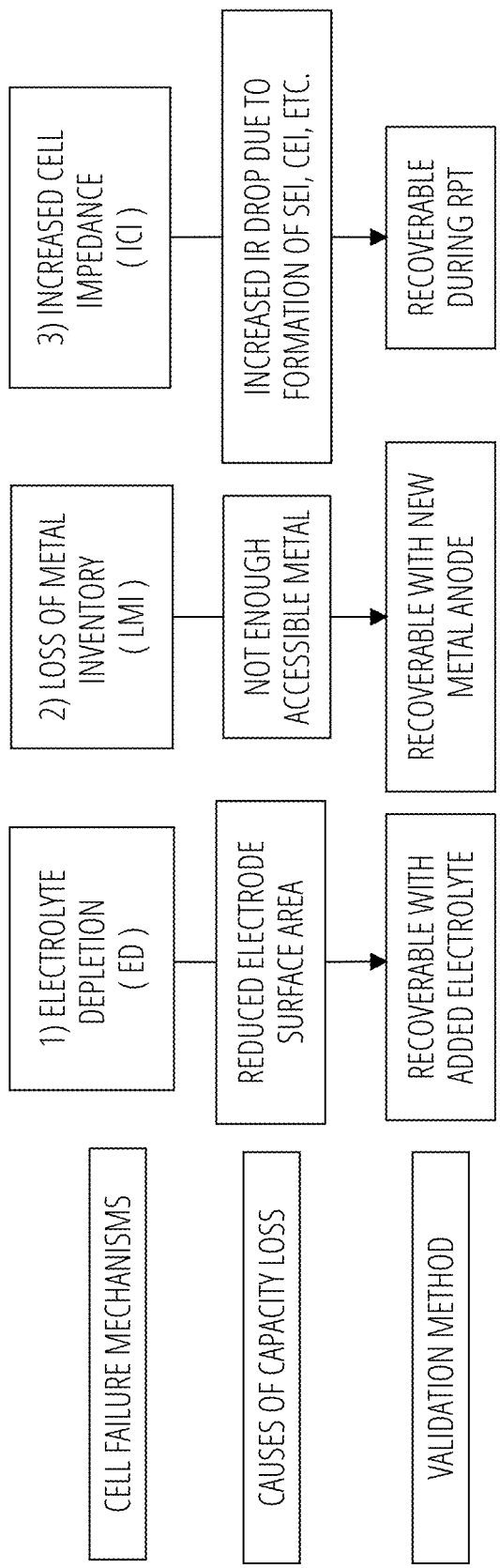
FIG. 1 is a chart showing various failure mechanisms for metal batteries, such as Li metal batteries, and the associated causes of capacity loss and validation methods.

To increase industry acceptance of metal-based batteries, such as Li metal batteries, desired are metal-based battery designs that optimize battery performance (e.g., battery capacity, battery life) while minimizing battery size. Designing such metal-based batteries involves developing or selecting various component designs and battery chemistries. Designing the batteries also involves testing such designs and chemistries under various conditions to evaluate the performance of the designs and chemistries and to develop improved batteries. For example, it may be desirable to evaluate various possible anode/cathode materials, electrolyte compositions, electrolyte concentrations, anode/cathode structures, etc., looking for the materials, compositions, concentrations, structures, etc., that achieve the greatest battery capacity and battery life in a small physical battery size. To efficiently evaluate the many possible materials, compositions, concentrations, structures, etc., it would be beneficial to have failure diagnosis methods and battery-life prediction methods that are fast and simple to conduct, such as the methods of embodiments of this disclosure.

To meet energy and cost targets, Li metal-based batteries with "lean" electrolytes (e.g., electrolyte in the amount of about 3 g/A·h or less) are generally strongly recommended. At lean electrolyte levels in Li metal batteries, there is hope of designing a Li metal battery with the advantage of a low redox potential (e.g., about −3.04 V relative to a standard hydrogen electrode (SHE)), a high theoretical capacity (e.g., about 3860 mA·h/g), and a small gravimetric density (e.g., about 0.534 g/cm$^3$). Therefore, Li metal battery design has drawn much attention in the past decade. Nevertheless, the practicality of designing a Li metal battery (e.g., having a Li metal anode) to achieve the desired performance parameters is presently hindered by the uncontrollable formation of dendritic or "mossy" Li at the anode during use of the Li metal battery and the resultant formation of "dead" or isolated Li due to uneven Li stripping/plating reacting with electrolytes on the anode surface. Li dendrites are generally induced by inhomogeneous distributions of space charge, current density on the anode surface, and cracks forming in a solid electrolyte interphase (SEI) of the battery.

Given the aforementioned challenges arising from the use of lithium anodes in conventional Li metal batteries, the "lifetime" of conventional Li metal-based batteries (e.g., the longest possible duration during which the batteries can functionally operate) has been much shorter than batteries designed with other anode materials, such as those with graphite anodes. Efforts have been made to extend the lifetime of Li metal-based batteries, such as by configuring Li metal batteries so that a stable SEI forms in situ, during operation, due to inclusion of additives in the electrolytes of the batteries; by pretreating the Li metal surface of the anode to form an artificial SEI prior to operation of the battery; and by implementing different charging protocols (e.g., pulse charge) in addition to applying high pressure on the cells (e.g., batteries) during cycling (i.e., the process of charging and discharging the batteries). The efforts have also included simulating and studying SEI compositions caused by different electrolyte compositions, concentrations, and volumes; simulating and studying lithium distribution due to the changes on electric field caused by different pore sizes of the cathode and the separator of the battery. The simulations and studies of SEI compositions and lithium distributions may enable a better understanding of the "dead" lithium formation problems as well as a better understanding of opportunities for extending cycle life (e.g., the maximum number of charge/discharge processes to which a battery may be subjected before no longer being capable for further charging or discharging).

Battery aging, usually in the form of capacity degradation and resistance growth, is one of the most challenging issues for system safety and has been intensively studied in conventional, commercial Li ion batteries. Complicating efforts to study battery aging are the several different mechanisms that can lead to failure (e.g., loss of battery capacity) of battery operability. With reference to FIG. 1, for example, commonly accepted failure mechanisms (e.g., "cell failure mechanisms") for lithium metal batteries—which failure mechanisms are similar to those of other Li ion batteries—are (1) electrolyte depletion (ED), (2) loss of metal inventory (LMI) (e.g., loss of Li inventory (LLI)), and (3) increased cell impedance (ICI). In ED (which may include depletion of electrolyte additives), the electrolyte of the metal-based cell is no longer able to facilitate ion (current) communication between the electrodes (e.g., the anode and the cathode) of the cell. ED may be due to, e.g., gassing of SEI formation. In LMI (or loss of metal inventory), not enough accessible metal (e.g., lithium) remains in the cell—both in the anode and in the cathode. In ICI, the utilization of active material (both of the anode and of the cathode) is lost, blocked, or otherwise degraded, particularly at high C rate (i.e., high current density during charge and/or discharge), so that the electrodes of the cell are less effective in the electrochemical process.

The failure mechanisms arise from one or more causes of capacity loss. Among them, the ED and the LMI failure mechanisms arise mainly from the capacity loss causes of (1) uncontrollable formation of SEI on the anode and (2) dead metal (e.g., Li) at the anode. Gas generation as a side reaction, due to electrolyte decomposition, can also lead to ED. The failure mechanism of ICI can be due to (3) the formation of SEI, CEI (cathode electrolyte interphase), etc., which is recoverable during RPT (reference performance test).

When a battery experiences a failure, the type of failure experienced—that is, which of the failure mechanisms has occurred—may be identifiable by certain systematic experiments, such as by adding additional electrolyte (such that, if the failure is resolved, it is understood that the failure mechanism was ED), by replacing the already-used metal anode (e.g., an already-used Li metal anode) with a new metal anode (e.g., a new Li metal anode) (such that, if the failure is resolved, it is understood that the failure mechanism was LMI), and/or by minimizing the electrode utilization issue through the repetitive reference performance test (RPT) at low C-rates (e.g., battery charge or discharge rate of, e.g., C/20, meaning a battery that fully charges or discharges over 20 hours) (such that, if the failure is resolved, it is understood that the failure mechanism was ICI).

Conventional failure-mechanism diagnosis methods, used with conventional Li ion batteries to address safety issues (e.g., to predict and identify failure mechanisms so that catastrophes may be avoided during use of the battery), may generally be classified as either model-based methods or as non-model-based methods. Model-based methods may be suitable in diagnosing the cause of failures in batteries or battery systems that that generally perform linearly, with direct correlation between causes and failures. However, many conventional batteries, particularly Li ion batteries, do not exhibit such linear relationships between cause and failure. Rather, Li ion batteries are a fully nonlinear electrochemical system not conducive to model-based approaches for diagnosing or predicting system failures. Non-model-based methods may avoid the challenges of failure diagnosis in nonlinear electrochemical systems (e.g., batteries). Non-model-based methods generally include testing an actual battery, or bank of batteries, and observing battery performance under test conditions. Such non-model-based diagnosis methods may be simpler and promote better dynamic performance than model-based diagnosis methods. However, conventional non-model-based diagnosis methods tend to be time consuming (e.g., requiring perhaps hundreds of cycles to reliably diagnose failures and predict battery life), expensive, destructive (e.g., involving damaging disassembly of the batteries being tested) and involve heavy-duty operating conditions. Conventional non-model-based diagnosis methods may also tend to provide limited information and so may necessitate several different techniques to be implemented to cause a failure condition, to discern the cause of a failure condition, and/or to predict battery life. For example, conventional non-model-based diagnosis methods may utilize gas sensing, measuring self-discharge current, and online impedance spectroscopy measurements.

Accordingly, the design of methods and systems for diagnosing failures in metal batteries, including Li metal batteries as well as other metal-based batteries, and for predicting battery life continue to present challenges, particularly as to designing methods and systems for simply, quickly, and nondestructively diagnosing failures and predicting battery life.

Various embodiments of the disclosure provide methods and systems for simply, quickly, and nondestructively diagnosing failure mechanisms in metal batteries and for predicting the life of such metal batteries. The methods include observation of battery rest voltage, after fully charging or discharging the metal battery of interest, in combination with Coulombic Efficiency (CE), to identify and discern one or more failure mechanisms. The methods also include use of anode-free cells—in place of the metal battery of interest—to quickly predict the lifetime of the metal battery of interest and without destructively disassembling the metal battery of interest. As discussed herein, the methods of the disclosure have been validated with experiments and modeling.

Conventional methods for lifetime evaluations of Li-ion batteries are generally time-consuming and expensive tasks, often making such methods impractical. That is, conventionally, the lifetime of some Li metal cells, and corresponding failure mechanisms experienced by such Li metal cells, are validated through long-term cycling of the Li metal cells. The long-term cycling can take up to several hundreds of cycles.

Other conventional methods (e.g., accelerated lifetime testing (ALT) methods) aim to accelerate the testing process by provoking battery degradation under heavy-duty operating conditions. ALT methods have been widely used in the art to test conventional Li ion batteries, solid oxide fuel cells, proton exchange membrane fuel cells, solar cells, etc. Ideally, such ALT methods would avoid causing new failure mechanisms, but the heavy-duty operation conditions raise the risk of such other failures and/or catastrophes.

The methods disclosed herein monitor and track changes in battery rest voltage, after full charge or discharge of the battery, in combination with detected Coulombic Efficiency (CE) values to quickly, simply, and reliably detect and identify failure mechanisms experienced by a target metal-based battery (e.g., electrochemical "cell"). Moreover, the methods disclosed herein include cycling an "anode-free" battery for a number of cycles (e.g., generally significantly fewer cycles than required with conventional methods, such as those that would directly test the target metal-based battery with its anode included) while monitoring and tracking the anode-free battery's discharge capacity. Based on the observed discharge capacity profile of the tested anode-free battery, the battery life of the target metal-based battery may be quickly, simply, and reliably predicted by mathematical calculation without disassembling the target metal-based battery. The effectiveness of the prediction methods disclosed herein was validated by different experimental approaches, as discussed below.

The methods and systems of the disclosed embodiments may not require (or, in at least some embodiments, involve) heavy-duty operating conditions or hundreds of cycles of a target metal-based battery. Thus, a great number of battery or battery material designs, compositions, concentrations, structures, etc., may be evaluated quickly and safely, under a variety of different operating conditions. Moreover, the methods and systems may also reliably identify failure mechanisms and predict battery life by simple evaluation techniques of monitoring rest voltage and CE (for the target metal-based battery) and monitoring discharge capacity (for the anode-free battery). Therefore, other battery-evaluation techniques (e.g., gas sensing, measuring self-discharge current, and online impedance spectroscopy measurements) may be unnecessary and wholly omitted, in some embodiments.

As used herein, the terms "battery," "battery cell," "cell," and "electrochemical cell" may be used interchangeably.

As used herein, a "target" battery is a battery—having a cathode, an anode, and an electrolyte—with structures, compositions, and/or concentrations thereof to be evaluated by the methods herein.

As used herein, an "anode-free" battery is an electrochemical cell having a cathode and an electrolyte, but having a so-called "current collector" electrode in place of an anode. The current collector may comprise one or more metal materials and be configured to collect charge during operation of the anode-free battery. More particularly, during charging of the anode-free battery, the active metal ions (e.g., Li ions) are extracted from the cathode, move to the current collector, and plate on the bare current collector, such that the plated current collector functions as the target metal anode. Subsequently, during discharging, the active metal ions (e.g., the Li ions) are stripped from the plating on the current collector and are intercalated back into the cathode. In this manner, during the charging, the active metal ions derived from the cathode effectively form, in situ, an active metal anode without there having been any active metal in the current collector prior to the charging and, at least in some embodiments, without active metal remaining on the current collector after complete discharging. In contrast, during operation of a battery that includes an anode, the active metal is already present in the anode before charging and remains in the anode after discharging.

Quantification of the above-mentioned failure mechanisms and/or battery lifetime may guide and enable faster, safer, and more cost-effective development of metal-based batteries (e.g., Li metal-based batteries) and the cell materials (e.g., advanced electrolyte materials) and structures (e.g., artificial SEI layers on anode surfaces) thereof. Not only could these fast evaluation (e.g., diagnosis) and prediction methods help accelerate the material development of metal-based batteries (e.g., Li metal-based batteries)—such as, for example, the evaluation and screening of various possible electrolyte compositions and concentrations, and/or the optimization of operating conditions for metal-based batteries—via high-throughput experiments, but the methods are expected to benefit the rational design of metal-based (e.g., Li metal-based) battery packs for optimization of the balance between high energy density, compact size, and long battery life (e.g., long cycle life).

Figure 2:
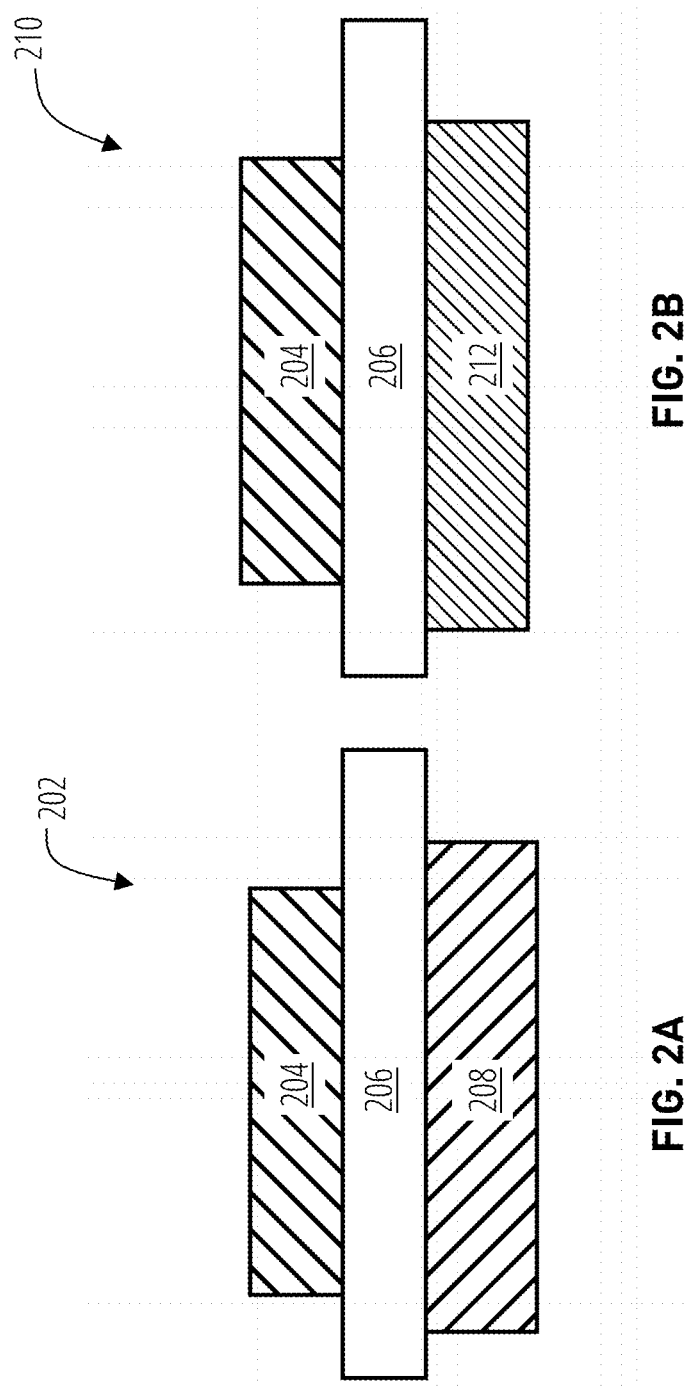
FIG. 2A is a cross-sectional, front elevational, schematic illustration of a metal battery cell for use in systems and methods, according to embodiments of the disclosure.
FIG. 2B is a cross-sectional, front elevational, schematic illustration of an anode-free cell for use in systems and methods, according to embodiments of the disclosure.

FIG. 2A and FIG. 2B illustrate cells according to systems and methods of embodiments of the disclosure. In FIG. 2A, illustrated is a metal battery cell 202, configured for use in methods and systems for diagnosing failure mechanisms through monitoring rest voltage and Coulombic Efficiency (CE), according to embodiments of the disclosure. The metal battery cell 202 includes a cathode 204, an electrolyte (and, in some embodiments, also a separator within or comprising the electrolyte, such that the electrolyte alone or the electrolyte-and-separator are each equally designated by reference number 206 in the figures), and an anode 208. The electrolyte (and, in some embodiments, the separator) 206 are disposed between the cathode 204 and the anode 208.

The cathode 204 comprises metal material(s). For example, the cathode 204 may comprise, e.g., metal oxide material(s), as in, for example, an "NMC" oxide cathode (e.g., a cathode comprising nickel (Ni), manganese (Mn), cobalt (Co), and oxygen (O), such as $LiNi_{0.8}Mn_{0.1}Co_{0.1}O_2$), an "NCA" oxide cathode (e.g., a cathode comprising Ni, Co, aluminum (Al), and O, such as $LiNi_xCo_yAl_zO_2$, wherein $x+y+z=1$), an "NFM" oxide cathode (e.g., a cathode comprising sodium (Na), Ni, iron (Fe), manganese (Mn), and oxygen, such as $Na(Ni_xFe_yMn_z)O_2$, wherein $0<x, y, z<1$); metal phosphate material(s); sulfur-based metal materials, as in a sulfur-containing cathode (e.g., $Li_2S$); fluorine-based metal materials, as in a fluorine-containing cathode (e.g., a cathode comprising a copper (Cu) fluoride, a nickel fluoride, an iron fluoride, or another metal fluoride); or organic materials, as in an organic cathode. Likewise, the anode 208 comprises metal material(s) that is(are) of a different composition than the metal material(s) of the cathode 204. For example, the anode 208 may be formed of or include one or more metals selected from lithium (Li), sodium (Na), zinc (Zn), potassium (K), palladium (Pd), iron (Fe), magnesium (Mg), calcium (Ca), strontium (Sr), barium (Ba), titanium (Ti), cobalt (Co), nickel (Ni), copper (Cu), silver (Ag), indium (In), aluminum (Al), gallium (Ga), tin (Sn), lead (Pb), bismuth (Bi), alloys thereof, or other combinations thereof.

The electrolyte 206 is formulated as an ion and electrical conductor that promotes transportation of ions from the cathode 204 to the anode 208 during charging of the metal battery cell 202 and from the anode 208 to the cathode 204 during discharging of the metal battery cell 202. The electrolyte 206 may include a metal-based electrolyte, comprising a metal-based salt (e.g., additive) in a solvent, of which salt a metal element thereof may also be within the metal material(s) of the anode 208. For example, in embodiments in which the anode 208 comprises, consists essentially of, or consists of lithium (Li), the salt of the electrolyte 206 may comprise, consist essentially of, or consist of one or more Li-containing compounds (e.g., $LiClO_4$, LiFSI (lithium bis (fluorosulfonyl) imide), $LiPF_6$). In some embodiments, the solvent(s) of the electrolyte 206 may comprise, consist essentially of, or consist of, e.g., organic carbonates or organic ethers.

In some embodiments, the electrolyte 206 may be characterized as "lean," having about 3 or fewer grams of electrolyte per amp-hour. In other embodiments, the electrolyte 206 may be characterized as "flooded," having about 10 or more grams of electrolyte per amp-hour. In still other embodiments, the electrolyte 206 may be characterized as "moderate," having between about 3 grams of electrolyte per amp-hour and about 10 grams of electrolyte per amp-hour.

Though the electrolyte and the separator (of some embodiments) 206 are illustrated in FIG. 2A as a singular region, the separator (of the separator and electrolyte 206) may be a thin, flat plate or disc—configured as a permeable membrane—disposed within the electrolyte and about midway between the cathode 204 and the anode 208. The separator (of the separator and electrolyte 206) may comprise a polymeric membrane in the form of a microporous layer. In some embodiments, the separator may be porous, the electrolyte may be a metal-based liquid, and the metal-based liquid of the electrolyte may be filled in the pores of the separator. In other embodiments, the electrolyte 206 may be or include a solid-state electrolyte or a gel-state electrolyte without a separator therein. For example, a solid-state electrolyte may comprise a metal ion conductive solid without a separator therein. Accordingly, the cells (e.g., the metal battery cell 202 and the anode-free cell 210, described below) are configured to enable use of the cells with liquid electrolytes or with solid electrolytes. Examples of more particular materials for the separator, for embodiments that include the separator in addition to the electrolyte 206, are discussed in the experiments and other examples below.

The metal battery cell 202 is configured for use in methods to diagnose failure mechanisms. As discussed further below, the metal battery cell 202 may be subjected to several cycles while monitoring and tracking rest voltage (e.g., discharge rest voltage and charge rest voltage) as well as Coulombic Efficiency (CE) to form a profile of both rest voltage and CE versus cycle (hereinafter a "rest voltage and CE profile"). The number of cycles run in embodiments of the disclosure may be significantly fewer than the hundreds of cycles often used in conventional methods. For example, the metal battery cell 202 may be used to discern and identify failure mechanisms by testing the metal battery cell 202 over fewer than about 100 cycles (e.g., fewer than about 50 cycles, fewer than about 30 cycles). Based on the rest voltage and CE profile, a failure mechanism experienced by the metal battery cell 202 may be distinguished between the various possible failure mechanisms discussed above. In other words, by tracking rest voltage and CE over relatively few cycles, it can be determined whether the metal battery cell 202 is failing due specifically to electrolyte depletion (ED), due specifically to loss of metal inventory (LMI) (e.g., loss of Li inventory (LLI)), or due specifically to resistance build up (e.g., increased cell impedance (ICI)). Therefore, the failure mechanism can be diagnosed quickly, enabling a greater number of failure mechanisms diagnoses to be completed within a shorter time frame, increasing the throughput of evaluations of the metal battery cell 202 under various operating conditions and/or with various materials, compositions, concentrations, structures, etc.

FIG. 2B illustrates an anode-free cell 210, configured for use in methods and systems for predicting the lifetime of a battery of the configuration of the metal battery cell 202. The anode-free cell 210 includes the cathode 204 (e.g., the same cathode as in the metal battery cell 202), the electrolyte 206 (e.g., the same electrolyte 206 and, in some embodiments, the same separator as in the metal battery cell 202 of FIG. 2A, e.g., the "target" metal-based battery). However, unlike the metal battery cell 202 of FIG. 2A, the anode-free cell 210 does not include (e.g., lacks) the anode 208. Instead, the anode-free cell 210 includes a current collector 212 comprising metal material(s) having a higher plating potential than the target metal material(s) of the anode 208 of the metal battery cell 202 (e.g., the target cell). In some embodiments, a cell may be selectively configured and transitioned between the metal battery cell 202 and the anode-free cell 210 by replacing the anode 208 (of the metal battery cell 202) with the current collector 212 (of the anode-free cell 210) and vice versa.

The metal material(s) of the current collector 212 may be formulated or otherwise configured to enable metal plating during charging of the anode-free cell 210 and to enable metal stripping during discharging of the anode-free cell 210. However, in contrast to the metal material(s) of the anode 208 of the metal battery cell 202, the metal material(s) of the current collector 212 are free of the ionizing metal (e.g., Li) that is in the cathode 204 and the electrolyte 206. For example, in some embodiments, prior to use of the anode-free cell 210, the cathode 204 and the electrolyte 206 may each include lithium (Li) (and/or one or more of the other metal materials discussed above), while the current collector 212 of the anode-free cell 210 is free of such lithium (Li) (and free of such one or more of the other metal materials discussed above, if included in the cathode 204 and/or electrolyte 206).

The metal material(s) of the current collector 212 for the anode-free cell 210 is formulated or otherwise selected to exhibit similar rates of consumption, during operation of the anode-free cell 210, as the rate of consumption exhibited by the anode 208 during operation of the metal battery cell 202. Therefore, the formulation and selection of the material(s) for the current collector 212 are tailored according to, e.g., the metal material(s) of the anode 208 of the target cell (i.e., the metal battery cell 202)—and the electrochemical stability thereof—and/or according to the compositions and concentrations of other materials of the metal battery cell 202, such as the electrolyte of the separator and electrolyte 206. In some embodiments, the anode 208 of the metal battery cell 202 is or includes lithium (Li), while the current collector 212 of the anode-free cell 210 may be or include, e.g., copper (Cu), because the Cu has a higher redox potential (e.g., higher plating potential) than Li, and the rate of consumption of Li on the current collector 212 (e.g., the Cu) during operation of the anode-free cell 210 is, in applicable embodiments, about the same as the rate of consumption of Li from the anode 208 during operation of the metal battery cell 202. In other embodiments, the anode 208 of the metal battery cell 202 is or includes zinc (Zn), while the current collector 212 of the anode-free cell 210 may be or include, e.g., steel. Therefore, the current collector 212 may comprise, consist essentially of, or consist of copper (Cu), steel, aluminum (Al), carbon (C), mixtures thereof, or other combinations thereof, provided the material(s) of the current collector 212 exhibit higher redox potential (e.g., higher plating potential) than the metal material(s) of the anode 208 of the metal battery cell 202.

In some embodiments, systems (e.g., for diagnosing failure mechanisms and for predicting cycle life of the metal battery cell 202) include at least two separate battery cells: at least one of the metal battery cell 202 and at least one of the anode-free cell 210. In other embodiments, the systems may include one or more battery cells that are reconfigurable as either the metal battery cell 202 or the anode-free cell 210. For example, the anode 208 of the metal battery cell 202 may be selectively removable to be replaced with the current collector 212. Additionally or alternatively, the current collector of the anode-free cell 210 may be selectively removable and replaceable with the anode 208.

The anode-free cell 210 is configured to be tested, in place of directly testing the metal battery cell 202, to predict the lifetime of the metal battery cell 202 (e.g., the target metal-based battery cell). Accordingly, to test the efficacy of a Li metal-based battery, an alternative metal-based anode-free battery may be tested, which metal-based material for the anode-free battery (e.g., the anode-free cell 210) may be less expensive, more readily available, or less hazardous than the material of the anode 208 in the target battery (e.g., the metal battery cell 202). Moreover, testing the anode-free cell 210 instead of directly testing the target metal-base battery cell may avoid disassembling and damaging the target cell. Alternatively or additionally, needed data may be collected using the anode-free battery (e.g., the anode-free cell 210) over fewer cycles than may be necessary to gather sufficient equivalent data directly from using the target metal-based battery cell (e.g., the metal battery cell 202). In other words, the anode-free cell 210 may function as a stand-in of sorts, usable to predict the maximum possible life of the metal battery cell 202 without having to directly test (or destructively disassemble) the metal battery cell 202 from its initial state to its ultimate "dead" state.

More particularly, and as discussed below, the inventors of the disclosed embodiments have identified that a metal-based battery exhibits substantially two phases of capacity loss (e.g., metal (e.g., Li) consumption) during operation of the metal battery cell 202 in circumstances in which conditions have been controlled so that the failure mechanisms of electrolyte depletion and increased cell impedance are avoided. In the first phase, the metal of the anode 208 is consumed, during operation, at a substantially consistent per-cycle rate. After the substantial consumption of the metal from the anode 208 during the first phase, the system transitions to a second phase during which the metal consumption (e.g., capacity loss) increases exponentially. With this understanding, and by formulating or selecting the metal of the current collector 212 of the anode-free cell 210 to exhibit a higher redox potential (e.g., higher plating potential) and a substantially similar rate of consumption of the ionizing metal (e.g., Li) from the cathode 204, during operation of the anode-free cell 210, as that of the anode 208 during operation of the metal battery cell 202, the anode-free cell 210 is configured to enable simple, fast, non-destructive, and reliable prediction of the life (e.g., cycle life) of the metal battery cell 202 by testing the anode-free cell 210.

According to embodiments of the disclosed methods for predicting the life of a metal battery (e.g., the metal battery cell 202), a substitute anode-free version of the metal battery (e.g., the anode-free cell 210) is subjected to several cycles (e.g., C/3 cycles) while monitoring and tracking the discharge capacity of the anode-free cell 210 to form a discharge capacity profile. The number of cycles implemented in this process may be, in some embodiments, substantially fewer than about 100 cycles (e.g., fewer than about 50 cycles, fewer than about 30 cycles, fewer than about 20 cycles).

From the observationally prepared discharge capacity profile of the anode-free cell 210, the capacity retention (i.e., the percentage of the capacity of a particular cycle compared to the previous cycle) can be further converted to metal consumption rate per cycle. Thus, the metal consumption rate per cycle of the anode-free cell 210 is discerned. Given the formulation and selection of the metal of the current collector 212 of the anode-free cell 210 to exhibit a substantially similar rate of consumption of the ionizing metal (e.g., Li) of the cell during operation, the discerned metal consumption rate of the anode-free cell 210 is substantially the same as the metal consumption rate of the metal battery cell 202. Therefore, the discerned capacity retention per cycle provides a discerned metal consumption rate, which is then used—along with a measured initial discharge capacity of the metal battery cell 202—to determine the thickness of the metal of the anode 208 of the metal battery cell 202 that would be lost per cycle during operation of the metal battery cell 202. Based on this thickness-lost-per-cycle value, and from a measurable initial thickness of the metal of the anode 208, the number of cycles (i.e., the "life") for the first phase of system operation is predicted.

The capacity retention per cycle, discerned from the discharge capacity profile of the anode-free cell 210, is also used to predict the number of cycles (i.e., the "life") for the second phase of system operation, i.e., the phase in which the remaining metal (e.g., metal from the cathode 204) is consumed at an exponential rate. By adding the predicted number of cycles for the first phase to the predicted number of cycles for the second phase, the total number of cycles (i.e., the total "life") of the metal battery cell 202 is predicted.

EXAMPLES AND RELATED EXPLANATIONS

Material and Methods
 Coin Cell Assembly

Using a metal battery cell configured like the metal battery cell 202 of FIG. 2A, a Li metal (170 μm-thick and 47 μm-thick) was used as the anode 208 of the metal battery cell 202. Using an anode-free cell configured like the anode-free cell 210 of FIG. 2B, a Cu plate was used as the current collector 212 (9/16 inch disk). In both the metal battery cell 202 and the anode-free cell 210, high loading NMC811 (e.g., a nickel-manganese-cobalt (NMC) oxide material ($LiNi_{0.8}Mn_{0.1}Co_{0.1}O_2$), from Pacific Northwest National Laboratory, 4.2 mA·h/cm², ½ inch disk) was used as a cathode (e.g., the cathode 204); Celgard 2325 (5/8 inch disk) was used as a separator (e.g., in the separator and electrolyte 206). The Cu plates (of the anode 208 and the cathode 204) were cleaned with sulfuric acid for twenty seconds and rinsed with ethanol before being dried under vacuum at room temperature overnight to prevent further oxidation. The polished Li metal foil (e.g., of the anode 208) was used directly as purchased. The electrolyte (of the separator and electrolyte 206) was made of ethylene carbonate (EC) and ethyl methyl carbonate (EMC) (e.g., EC:EMC (3:7) with 10% wt VC). $LiPF_6$ was added to prepare different concentrations of the electrolyte.

Figure 3:
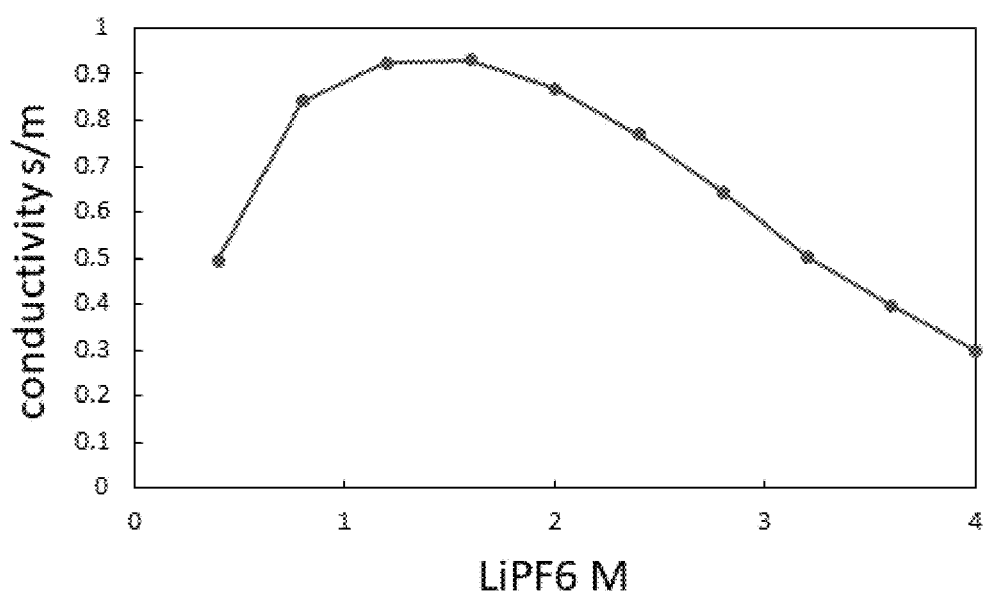
FIG. 3 shows different $LiPF_6$ concentrations in electrolyte and their corresponding conductivities.

The conductivities of a series of electrolyte with different salt concentrations were analyzed using a conductivity meter (model) at 20±1° C., such conductivities shown in the graph of FIG. 3. FIG. 3 shows different $LiPF_6$ salt concentrations (in the electrolyte) and their corresponding conductivities.

Three different electrolyte volumes were selected to provide flooded (e.g., at least about 10 g electrolyte per Amp hour), moderate (e.g., between about 3 g electrolyte per Amp hour and about 10 g electrolyte per Amp hour), and lean electrolyte (e.g., no more than about 3 g electrolyte per Amp hour), as shown in TABLE 1.

TABLE I

| ELECTROLYTE CONDITIONS | | |
|---|---|---|
| Conc. | Volume | g/Ah |
| 1.6M | 48 | 10.47 |
|  | 24 | 5.24 |
|  | 12 | 2.62 |

Testing Protocol

All the cells (e.g., the metal battery cell 202) with the different electrolyte conditions of TABLE 1 and the anode-free cell 210 with the different electrolyte conditions of TABLE 1 were tested using the following protocol: three formation cycles (C/10), reference performance test (RPT, C/10 and C/20), aging cycling (C/3). For every twenty aging cycles, one RPT test was carried out. For each cell, the discharge capacity of the last formation cycle was used as the cell capacity in the following RPT and aging cycles. The voltage cutoffs for charge and discharge were 4.4 V and 2.8 V. At the end of charge and discharge, the final voltage data were collected at the end of a fifteen minute (15 min) rest (e.g., rest voltage data). From the C/20 cycle of the RPT test, a differential capacity (dQ/dV) curve was generated.

Diagnosing Failure Mechanisms
 Cu∥NMC Due to Loss of Li Inventory (LLI)

Figure 4A:
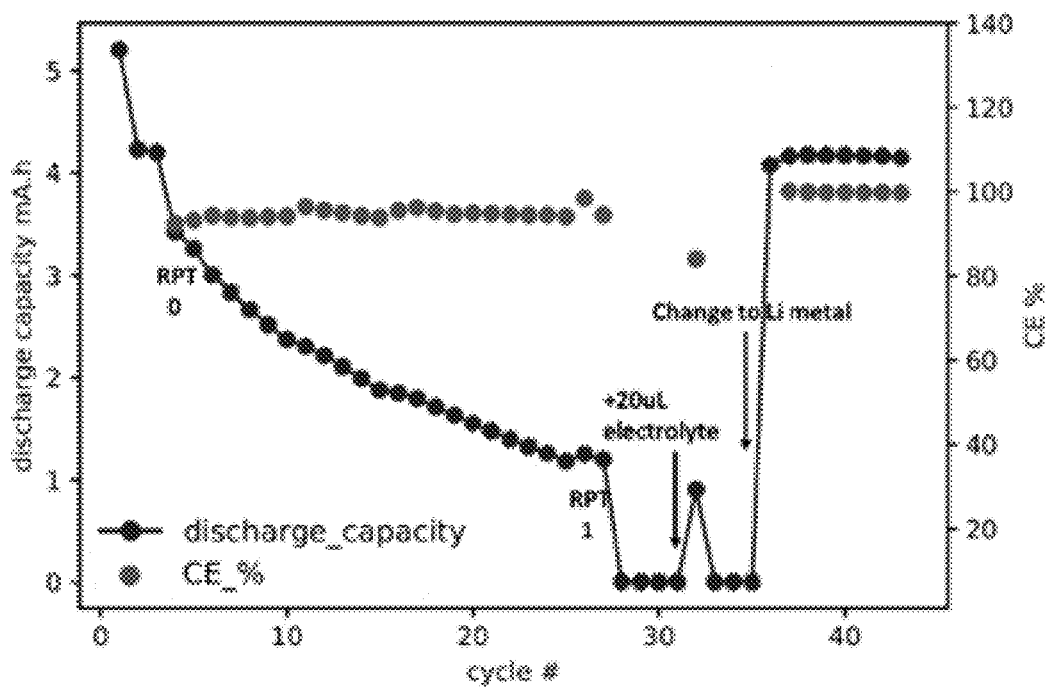
FIGS. 4A and 4B show the cycle life of Cu∥NMC cells (anode-free cells) for 1.6M "flooded" electrolyte with recovery process (in a discharge capacity and CE profile of FIG. 4A), and its differential capacity (dQ/dV) curves (FIG. 4B).
Figure 4B:
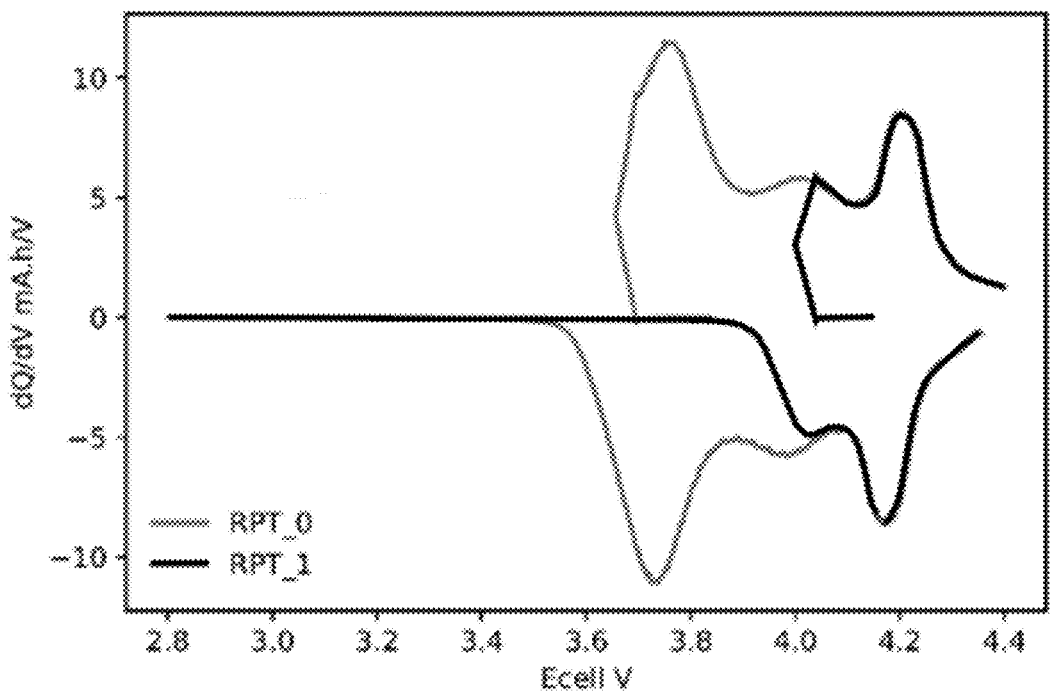

FIG. 4A and FIG. 4B show the cycle life of Cu∥NMC cells (e.g., anode-free cells 210) for 1.6M flooded electrolyte with a recovery process (FIG. 4A) and its differential capacity (dQ/dV) curves (FIG. 4B).

The capacity fade for Cu∥NMC cells (e.g., the anode-free cells 210) started from the beginning of the test (FIG. 4A) until the end of cycle life (at cycle 27). Adding more electrolyte to a dead Cu∥NMC cell (anode-free cell 210) (at cycle 31) could not recover the cell capacity, but changing the current collector 212 to a new Li metal anode (e.g., the anode 208, to reconfigure the anode-free cell 210 into the metal battery cell 202) (at cycle 35) recovered the capacity of the anode-free cell 210 to 97% compared to cycle 3 (end of formation cycle). This indicates that the Cu∥NMC cells (e.g., the anode-free cells 210) died (at cycle 27) primarily due to a LMI failure mechanism. That is, by cycle 27, effectively all lithium from the NMC cathode (e.g., the cathode 204) (i.e., the only initial source for lithium in the anode-free cell 210) had collected upon the current collector 212 (Cu plate). With all of the lithium of the anode-free cell 210 being at the current collector 212, in the form of SEI or dead lithium, no active lithium remained on both electrodes (e.g., the cathode 204 and the current collector 212) to facilitate the phase transition on the cathode 204 or lithium plating/stripping at the current-collector side. Thus, the anode-free cell 210 died at cycle 27 due to an LMI (e.g., LLI) failure mechanism.

Before cycle 27 in FIG. 4A, the Coulombic efficiency (CE) remained around 90%, indicating a continuous loss of Li (from the cathode) in each cycle. After changing the copper current collector 212 to (e.g., removing and replacing the copper current collector 212 with) a new Li metal anode (e.g., the anode 208), reconfiguring the anode-free cell 210 to the metal battery cell 202, the CE increased to nearly 100%, which indicates a good cell condition with sufficient lithium source and electrolyte amount.

Differential capacity curves were generated for the Cu∥NMC (e.g., the anode-free cell 210) (FIG. 4B). The RPT 0 curve was generally used as a baseline because it was performed between the formation cycle and the aging cycles, where the cells (e.g., the anode-free cells 210) are in good condition. In FIG. 4B, the RPT 0 showed three phase-transition peaks on both charge and discharge stages. The RPT 1 (at cycle 25) showed the peaks at only a high voltage range compared to the three full peaks shown during the RPT 0. This is because there was not enough accessible Li in the cell—i.e., Li in the cathode 204—so the NMC cathode (the cathode 204) could not be charged back to the original status even at a low current of C/20. The RPT 1 peaks overlapped well with the RPT 0 peaks at the high voltage range, indicating that, except for the loss of Li (from the cathode 204), there was no significant change of the cell components.

Li||NMC Due to Electrolyte Depletion (ED) or Increased Cell Impedance (ICI)

Figure 5A:
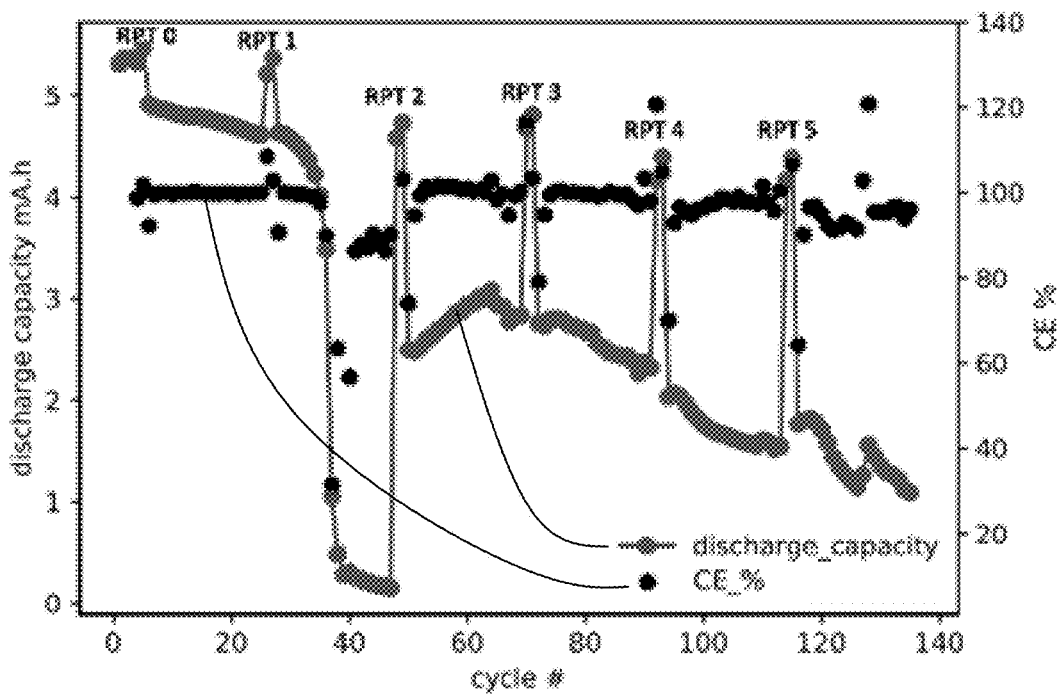
FIGS. 5A and 5B show the cycle life of Li∥NMC cells (metal battery cells) (170 µm-thick anode) for 1.6M flooded electrolyte, with FIG. 5A showing a discharge capacity and CE profile for the Li∥NMC cells and with FIG. 5B showing its respective differential capacity (dQ/dV) curves.
Figure 5B:
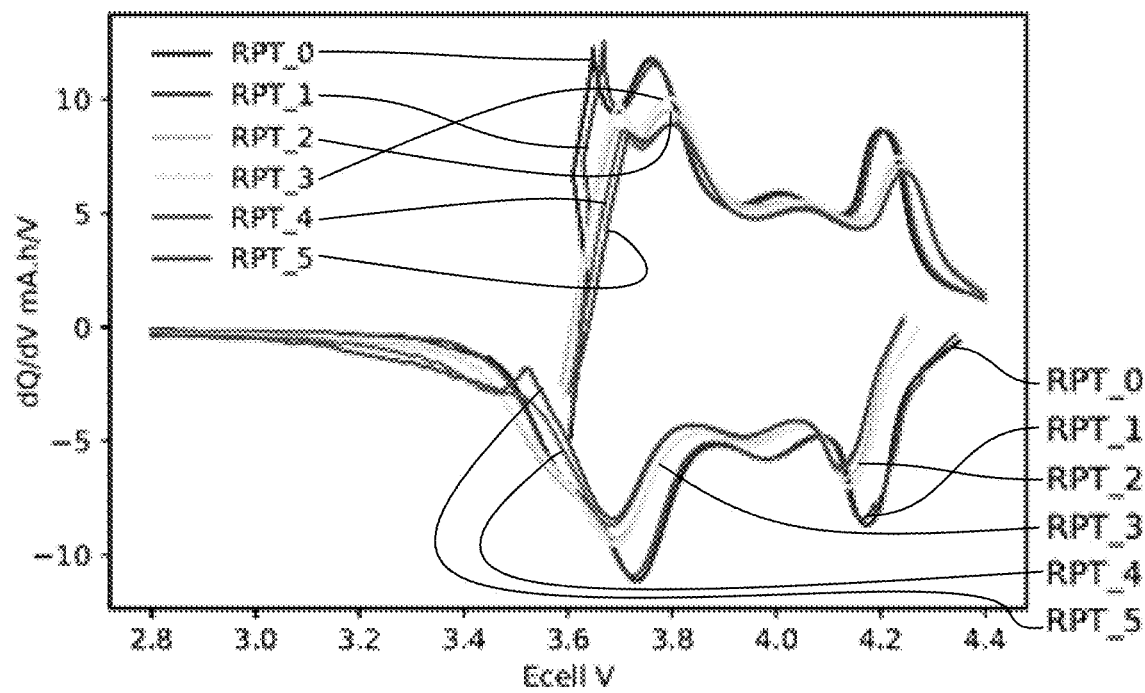

FIG. 5A and FIG. 5B show the cycle of life of Li||NMC cells (e.g., metal battery cells 202 with lithium anode 208) (170 μm-thick) for 1.6M flooded electrolyte (FIG. 5A) and its differential capacity (dQ/dV) curves (FIG. 5B).

An example was shown in the discharge capacity and CE profile of FIG. 5A for the initial lifetime and the subsequent cell recovery of the Li||NMC cell (e.g., the metal battery cell 202). The cell showed a gradual capacity fade in the beginning of life, which is similar to most other studies, before a catastrophic decrease starting from cycle 38. At the same time, the CE decreased from about 100% to as low as 30%. This was probably because the electrolyte consumption usually happens during the charging process, which causes a significant difference between the charge and discharge capacities.

After the Li||NMC cell (e.g., the metal battery cell 202) reached the initial end of cycle life (at cycle 48), additional electrolyte of 48 μL was added to the cell, and the cell capacity almost showed a full recovery in the following RPT 2. This indicated that the initial failure of the Li||NMC cell was mainly due to an electrolyte depletion (ED) failure mechanism. During the subsequent cycles, the cell capacities at C/3 were about half of the fresh cells. The large capacity drop between the RPT 2 and the following C/3 cycles was caused by a high cell impedance. The observed CE levels remained close to 100%.

With reference to FIG. 5B, the dQ/dV curve for RPT 2 was different from the dQ/dV curves for the RPT 0 and RPT 1, with the reduced peak intensities and a shift of peak voltages towards the lateral range, which were caused by an increased cell impedance (ICI) failure mechanism. Since the cell impedance was increased, a higher overall voltage was needed to complete the cathode phase transition, thus causing the shift of peak voltages; at the same time, the voltage cutoffs in the testing protocol remained the same, resulting in decreased peak intensities and overall cell capacity. The subsequent dQ/dV curves for RPT 3 through RPT 5 showed a similar pattern as the dQ/dV curve for RPT 2, further confirming the low cell capacity after the recovery was due to the ICI. It is contemplated that the reason for ICI may be the continuous formation of dead Li and SEI on the anode 208 surfaces. The formation of CEI may also be a potential reason, but previous studies have shown that the effect may not be as significant.

Compared to the Cu||NMC dQ/dV curves (for the anode-free cells 210) in FIG. 4B, the Li||NMC cells (metal battery cells 202) did not lose any peaks in the dQ/dV plot (FIG. 5B), indicating that the accessible Li source (from the anode 208 of the metal battery cells 202) was enough for the cathode phase transitions at a low C-rate of C/20. Since the dQ/dV curves for RPT 0 and RPT 1 overlapped well, and the dQ/dV curves for RPT 2 through RPT 5 overlapped well, mechanical disruption on the cathode 204 when opening the cell (e.g., the metal battery cell 202) may have been the only reason that caused the capacity loss during the RPT cycles before and after the recovery. Thus, the final failure mechanism of the 1.6M Li||NMC cell was the ICI.

Fast Diagnosis of Different Failure Mechanisms

Based on the results from the previous section, three cell failure mechanisms were concluded for the two types of cells (Cu||NMC (e.g., anode-free cell 210), Li||NMC (e.g., metal battery cell 202)) in the current experimental setup: ED, LLI, and ICI. These failure mechanisms can be distinguished and validated based on a comprehensive comparison on the dQ/dV curves, CEs, and cell recovery process. In practical application, it may not be realistic to open and recover the cells, and the long RPT cycles may not be able to be performed. Therefore, a more applicable method is needed to quickly distinguish the different failure mechanisms without additional test(s), which solution is provided by the methods of embodiments of this disclosure. In this section, described are examples of such methods of embodiments of the disclosure, in which rest voltage data, together with CE data, is used to differentiate the three failure mechanisms.

Cu||NMC cells (e.g., anode-free cells 210) and Li||NMC cells (e.g., metal battery cells 202) under flooded, moderate, and lean electrolyte conditions (1.6M LiPF$_6$) were tested following the protocol in the experimental section. The rest voltage data was collected at the end of a fifteen minute (15 min) rest after full charge and discharge for each cycle.

Capacity profiles for Cu||NMC cells (e.g., anode-free cells 210) (FIG. 6A) and Li||NMC cells (e.g., metal battery cells 202) (FIG. 6B, 47 μm-thick) using 1.6M electrolyte, and their corresponding CE (FIG. 6C and FIG. 6D, respectively) and rest voltage (FIG. 6E and FIG. 6F, respectively) profiles were prepared through testing of the cells and tracking of the data. Discharge capacity profiles of the Li||NMC cell (e.g., the metal battery cell 202) described above and its corresponding rest voltage profile were also prepared, as shown in FIG. 6G and FIG. 6H, respectively. Notably, the discharge capacity and CE profile of FIG. 6G is identical to the discharge capacity and CE profile of FIG. 5A.

Figure 6A:
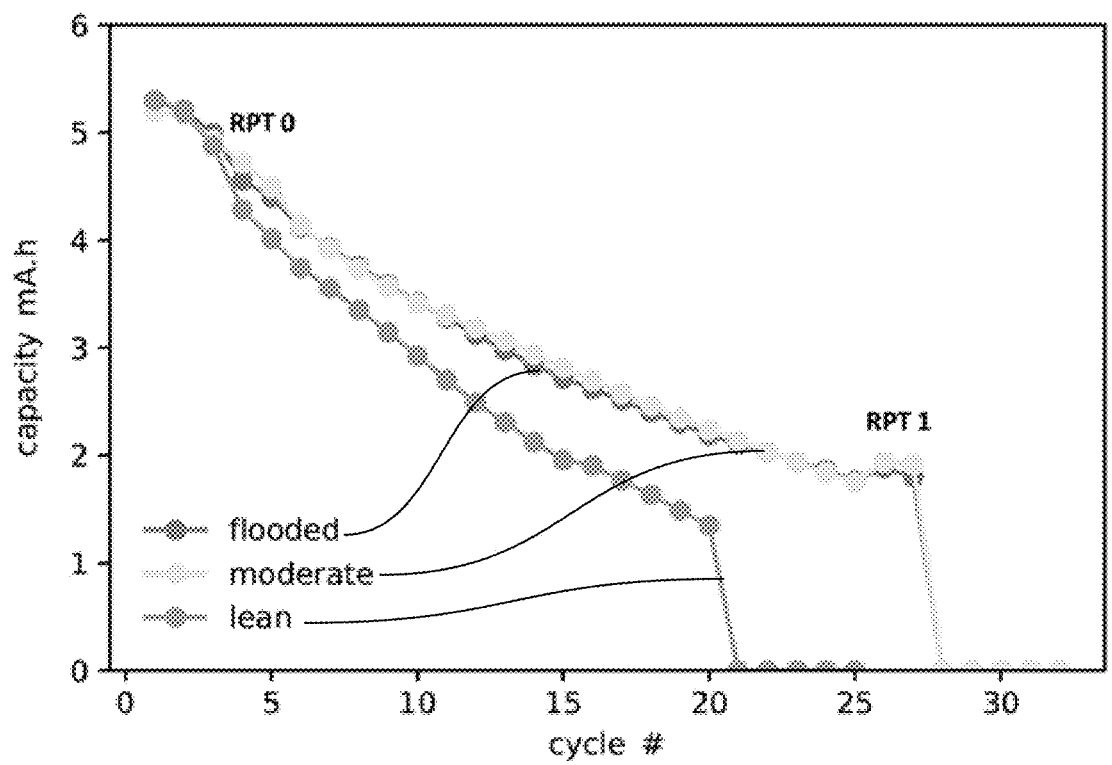
FIGS. 6A through 6H show capacity profiles for Cu∥NMC cells (anode-free cells) (FIG. 6A) and Li∥NMC cells (metal battery cells) (FIG. 6B, 47 µm-thick) using 1.6M electrolyte, their corresponding CE profiles (FIG. 6C and FIG. 6D, respectively) and rest voltage profiles (FIG. 6E and FIG. 6F, respectively).
Figure 6B:
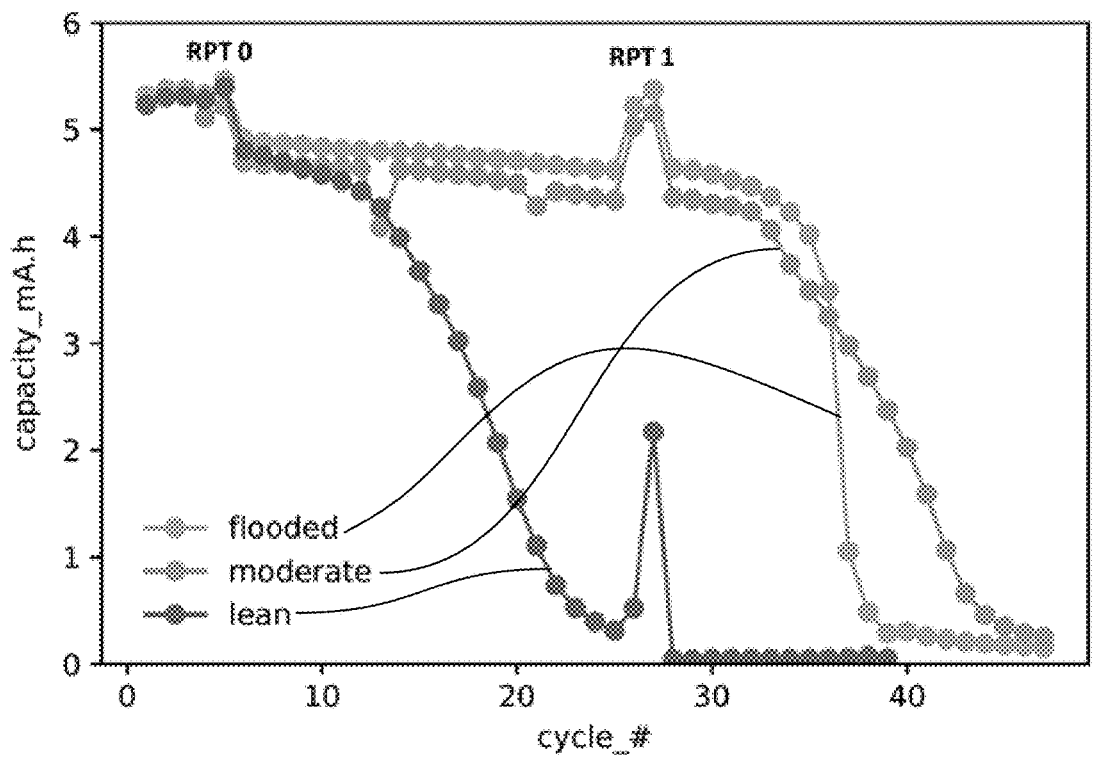

The capacity retentions of different cells were compared in FIG. 6A for Cu||NMC cells (anode-free cells 210) and in FIG. 6B for Li||NMC cells (metal battery cells 202). Regardless of the electrolyte volume, for 1.6M electrolyte, the Cu||NMC cells (anode-free cells 210) started with a similar initial capacity (see FIG. 6A, at cycle 0 for each of the flooded, moderate, and lean electrolyte levels) and died quickly within a total of 27 cycles. The cells (anode-free cells 210) with lean electrolyte levels had a shorter cycle life, and their fading rate was quicker compared to that of the cells (anode-free cells 210) with the flooded and moderate electrolyte levels. With reference to FIG. 6B, for the Li||NMC cells (metal battery cells 202), the lifetime also showed a positive correlation with electrolyte level, which is consistent with previous published results that indicate having more electrolyte may benefit overall cycle life.

Figure 6C:
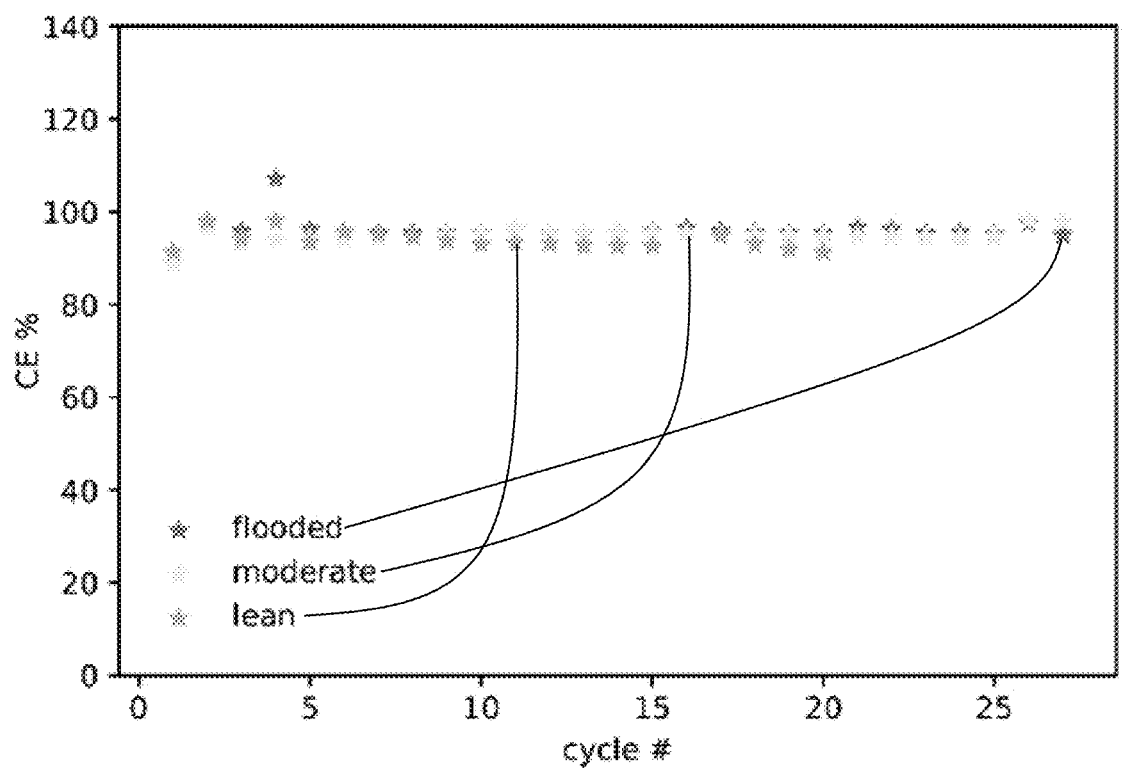
Figure 6D:
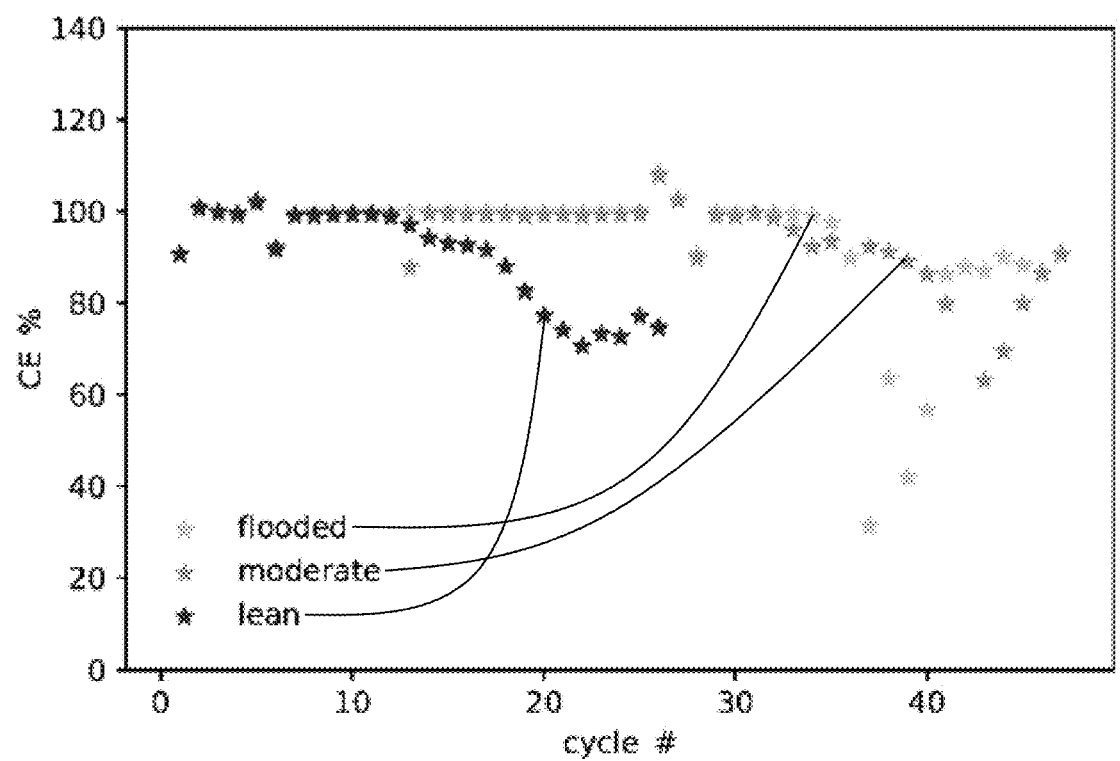

The corresponding CEs are shown in FIG. 6C (for the anode-free cells 210) and FIG. 6D (for the metal battery cells 202). From these, it is clear that when there is loss of Li inventory from a battery cell, the CE remains constantly around 90% (see FIG. 6C concerning Cu||NMC cells (anode-free cells 210)); when there is ED, the CE reduces quickly and significantly to a low value of less than 80% (see FIG. 6D concerning Li||NMC cells (metal battery cells 202)); and when the cell impedance increases (e.g., a type of loss of active material of the cathode failure mechanism), there is no significant change on the CE, which is close to 100% (see FIG. 6D concerning the Li∥NMC cells (metal battery cells 202)).

Figure 6E:
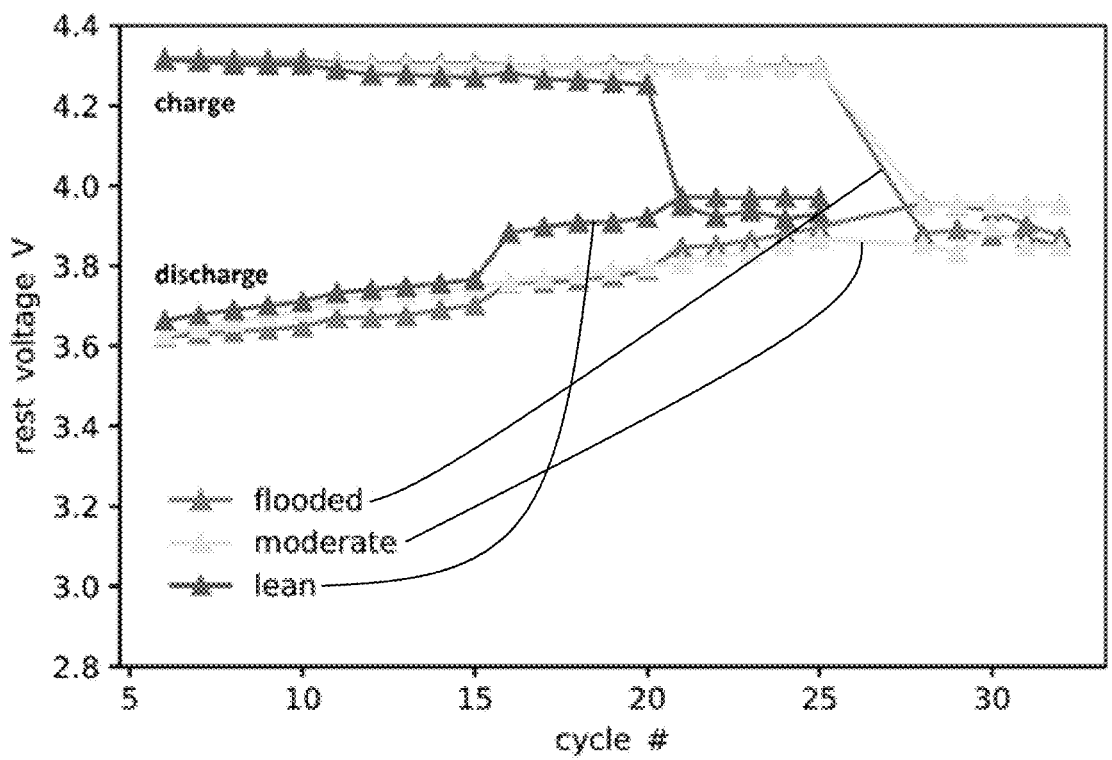
Figure 6F:
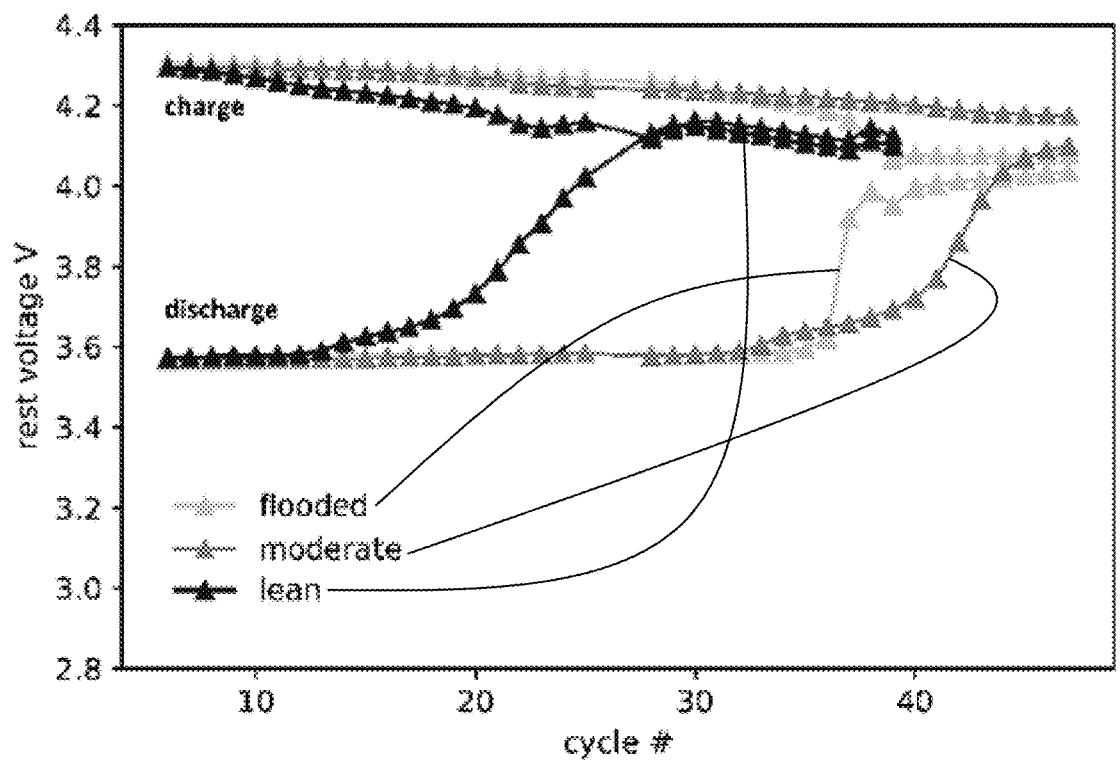
Figure 6G:
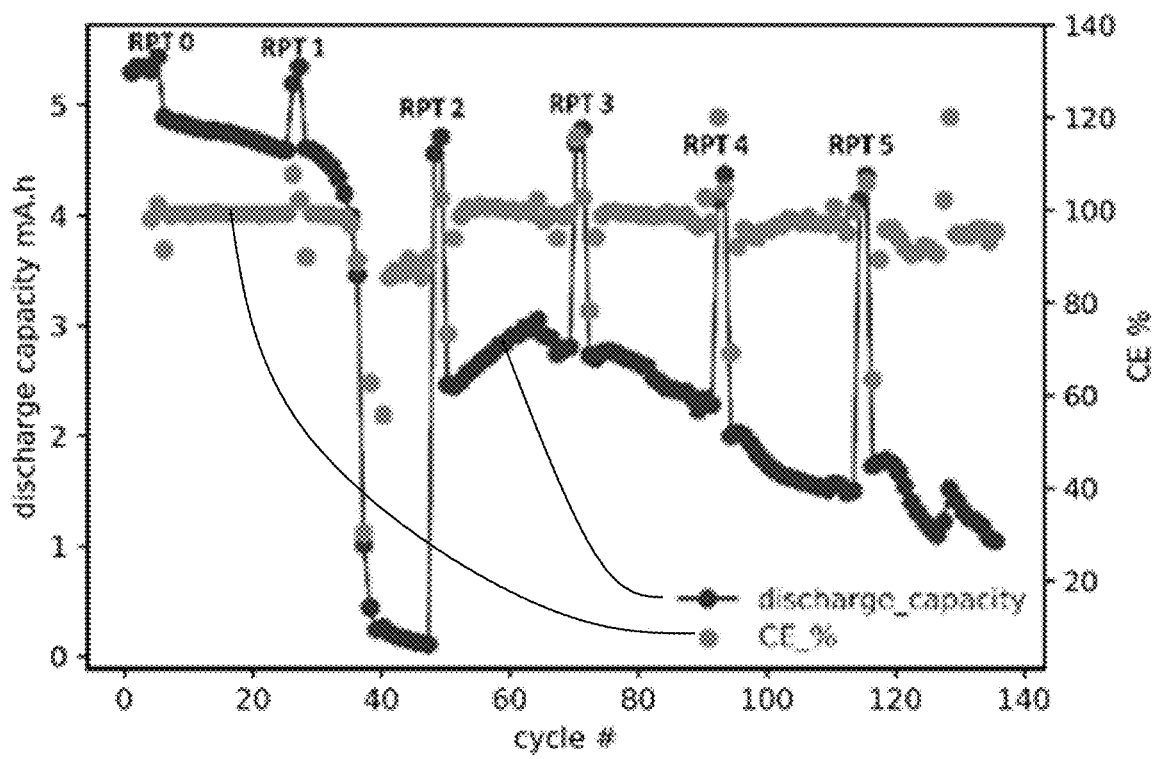
Figure 6H:
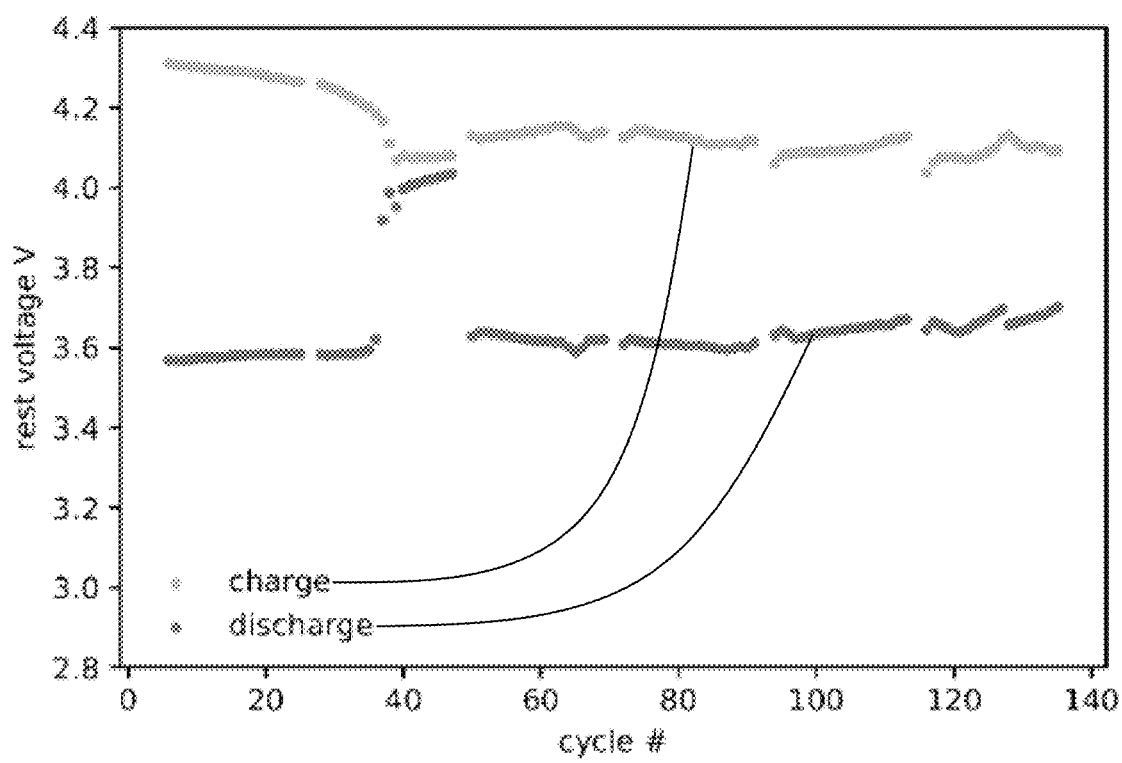

Besides the CE, rest voltage values are plotted in FIG. 6E (for the anode-free cells 210) and in FIG. 6F (for the metal battery cells 202), where the trends of the rest voltage profiles between the two types of cells (three failure mechanisms) were clearly discernable. For Cu∥NMC cells (anode-free cells 210) (see FIG. 6E), the discharge rest voltage profile kept increasing in a nearly linear way regardless of the cell capacity (see FIG. 6A). This increase in discharge rest voltage (FIG. 6E) shows a continuous change of NMC cathode (cathode 204) status, that at the end of discharge, the cathode 204 could not be fully lithiated to the original stage in the beginning of life, which is due to the LMI (e.g., LLI) from the Cu∥NMC cell (anode-free cell 210) cathode 204. The charge rest voltage (FIG. 6E) remained almost stable before a sudden drop at the end of cycle life. The final discharge voltage of Cu∥NMC cells (anode-free cells 210) was determined by the Li content in the cathode 204 (i.e., the "cathode status" referenced above). Therefore, when the Cu∥NMC cells (anode-free cells 210) died with no accessible Li in the cathode 204, the cells could be charged anymore, and the charge rest voltage converged down to the discharge rest voltage as shown in FIG. 6E.

When the Li∥NMC cells (metal battery cells 202) reached their end of life, it was clearly shown, in FIG. 6F, that the discharge rest voltage began to rise extensively and simultaneously with a catastrophic drop in the cell capacity (FIG. 6B) and the CE (FIG. 6D). Different from the Cu∥NMC cell (anode-free cell 210), in which the charge rest voltage converged down to the discharge rest voltage as shown in FIG. 6E, for Li∥NMC cells (metal battery cells 202), the discharge rest voltage converged up to the charge rest voltage as shown in FIG. 6F. This was because the electrolyte consumption mainly happened during charging, so that when the electrolyte amount reached such a critical point that it began to limit the cell capacity (of the metal battery cell 202), the discharge rest voltage started to increase. As shown in FIG. 6F, unlike the LMI that lasted for over about twenty cycles (see cycle 0 through about cycle 20), the electrolyte was consumed quickly in less than ten cycles (see cycle 20 through about cycle 29). At the last cycle (see about cycle 29 of FIG. 6F), after the electrolyte was fully consumed during the charging, the cells were "dried out" and could not be discharged anymore. Therefore, on the rest voltage profile (FIG. 6F), the discharge rest voltage converged up to the charge rest voltage. This can also be seen from FIG. 6G in coordination with FIG. 6F, where the cell (the metal battery cell 202) suffered from ED starting from cycle 38.

After adding more electrolyte to the dead Li∥NMC cells (FIG. 6H at cycle 48), the rest voltages split apart instantly. This further confirmed that when the cells died, the cathode 204 remained at a low Li content status, and the cells could not discharge due to the lack of ionic conduction caused by ED. After adding more electrolyte, the cell (metal battery cell 202) was able to continue the test, and the discharge rest voltage split apart from the charge rest voltage (see FIG. 6H). As shown in FIG. 6G, the cell (metal battery cell 202) then suffered from impedance buildup (e.g., ICI) after recovery at cycle 48. In the rest voltage profile (FIG. 6H), the charge and discharge rest voltages did not show any significant change after cycle 48.

Figure 7A:
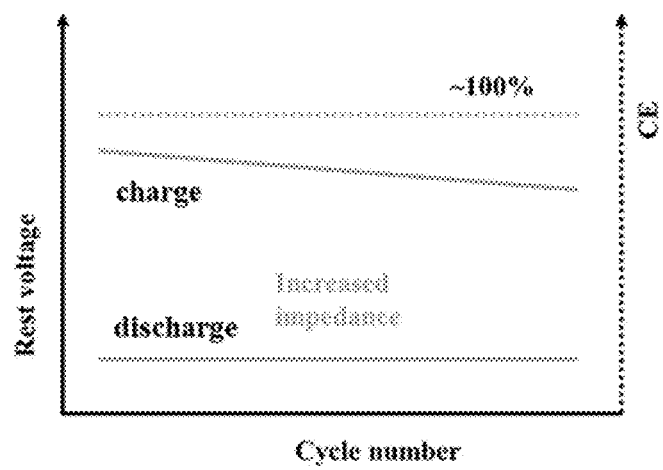
Figure 7B:
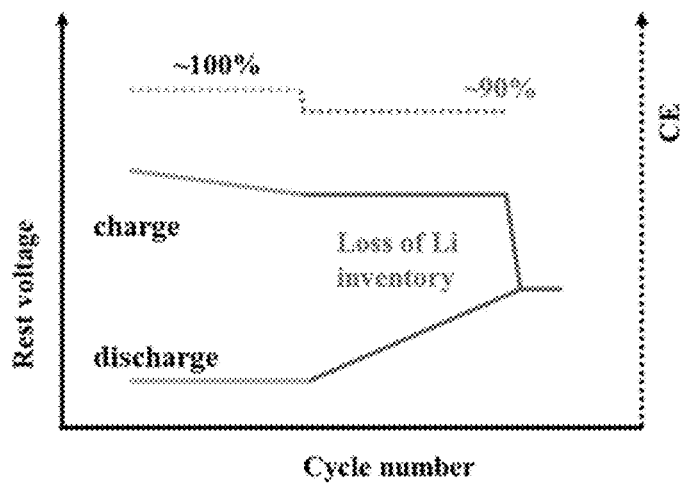
Figure 7C:
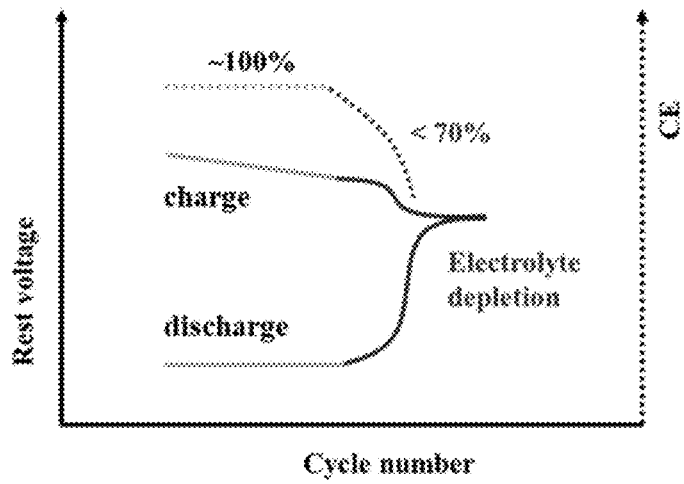

Failure Mechanism Diagnostics Based on Rest Voltage and CE Profiles of Metal Battery Cell FIG. 7A, FIG. 7B, and FIG. 7C summarize a schematic model of different failure mechanisms, based on the analysis discussed above, and using rest voltage and CE profiles as indications. For Li metal cells (metal battery cells 202), there are three main failure mechanisms: ICI (see FIG. 7A), LMI (e.g., LLI) (see FIG. 7B), and ED (FIG. 7C), all discernable from rest voltage and CE profiles. Accordingly, solely by monitoring and tracking the rest voltage ($V_c$: after charge, otherwise referred to herein and in the figures as the "charge" rest voltage, $V_d$: after discharge, otherwise referred to herein and in the figures as the "discharge" rest voltage) and CE of the metal battery cell 202—in some embodiments, over relatively few cycles (e.g., fewer than about 100 cycles)—the failure mechanisms experienced by the metal battery cell 202 may be diagnosed without the need of additional investigation. Comparing the changes of $V_c$ and $V_d$, if the decrease of $V_c$ is not smaller than the increase of $V_d$ (or if the changes of $V_c$ and $V_d$ are both minimal), the corresponding failure mechanism is ascribed to ICI. (See FIG. 7A.) In this situation, the CE is substantially constant and close to 100%, which is the highest CE among the CE observable from the three failure mechanisms. In most cases, operation of metal battery cells 202 (e.g., metal battery cells 202 that include the active metal anode (anode 208)) begins with an impedance buildup, rather than with ED or LMI during the early cycles. However, if the observed decrease of $V_c$ is minimal and the observed increase of $V_d$ is pronounced, CE should be taken into consideration as a second parameter. If CE exhibits a relatively constant trend but the value is smaller than CE during ICI, then the metal battery cell 202 is experiencing a dominant failure mechanism of LMI. (See FIG. 7B.) Otherwise, if CE shows a fast-declining trend (e.g., to less than 80% in the current example), then the dominant failure mechanism should be ED. (See FIG. 7C.) Notably, the CE values of 100%, 90%, and 80% indicated in FIGS. 7A through 7C may be different based on actual cell conditions, but the trend indicated in each of FIGS. 7A through 7C is more important for diagnostic purposes. That is, when there is LMI (see FIG. 7B), the CE remains relatively constant at a relatively higher value; in comparison, when there is ED (see FIG. 7C), the CE decreases quickly and significantly to a lower value; and when there is ICI (see FIG. 7A), the CE shows a constant CE value higher than the CE for both the LLI and ED.

When the cells (metal battery cells 202) are being cycled, the formation of SEI (on the anode 208), CEI (on the cathode 204), and dead Li (at the anode 208) may cause an increase on the cell impedance (FIG. 7A). Moreover, the ED (FIG. 7C), including loss of both salt and solvent, may also change the conductivity of the electrolyte, either by increasing or decreasing the conductivity thereof. With the ICI (FIG. 7A), more IR drop (ohmic overpotential caused by a resistor and a current passing through it) happens inside the cell (the metal battery cell 202), and thus, with the same voltage cutoff of 4.4V, the cathode 204 becomes more lithiated at the end of charge, which result in a decreasing charge rest voltage (see FIG. 7A). However, during the discharge, since 2.8V cutoff is low enough to overcome the cell impedance for the Li+ transfer back to the cathode 204, the discharge rest voltage remains flat throughout the cycling (see FIG. 7A).

As the Li metal cell (metal battery cell 202) continues to be cycled, it may suffer from different failure mechanisms, including LMI (FIG. 7B) and ED (FIG. 7C) based on the individual cell condition with a sign of substantial capacity decrease. When there is an LLI (FIG. 7B), the charge rest voltage stays substantially constant (see flat, upper, solid line portion of FIG. 7B) as the cathode 204 delithiation status remains constant; while the discharge rest voltage steadily increases (see sloped, lower, solid line portion of FIG. 7B), since the Li inventory is reduced each cycle and the cathode lithiation status steadily decreases at the end of discharge. The CE (see upper, dotted line of FIG. 7B) during this period is reduced to and remains substantially constant around 90% (actual value may be different depending on the cell condition), which is lower than during the increased cell impedance (see upper, dotted line of FIG. 7B). When the cell (metal battery cell 202) reaches the end of the cycle life, there is not enough accessible Li source to overcome the energy barrier, and the cell cannot be charged anymore. As a result, the charge rest voltage converges down to the discharge rest voltage (see converging, solid line portions of FIG. 7B).

With reference to FIG. 7C, when the ED happens quickly or the electrolyte amount is insufficient, such as in a lean electrolyte condition, the cell (metal battery cell 202) may encounter the third failure mechanism, ED (FIG. 7C). When the electrolyte is consumed to a critical point that the remaining electrolyte cannot fully wet the cathode 204, the cathode 204 is unable to be fully lithiated back to the original status, as some part of the cathode 204 has lost contact with the anode 208 through the electrolyte (of the separator and electrolyte 206). Even with the solid-solid Li$^+$ diffusion between the cathode active material particles, the diffusion coefficient is low compared to the liquid-solid diffusion through the electrolyte under current, and during charge, the cathode 204 cannot be lithiated back to the previous status when there is enough electrolyte. In most cases, the electrolyte consumption happens during charging, and the cell eventually reaches a condition in which almost all the electrolyte is consumed and the cell cannot discharge anymore. Thus, the discharge rest voltage converges up to the charge rest voltage (see converging, solid line portions of FIG. 7C).

Lifetime Prediction Methods Based on Testing with Anode-Free Cell

In order to predict the maximum lifetime (e.g., cycle life) of the Li‖NMC cells (the metal battery cells 202), testing was carried out using Cu‖NMC (the anode-free cell 210) as a quick tool. The Cu‖NMC (anode-free cell 210) provides meaningful data from this testing because, in the absence of the anode 208 of the target Li‖NMC cell (the metal battery cell 202) and the assurance of sufficient electrolyte levels (e.g., flooded electrolyte), the only failure mechanism that the anode-free cell 210 can possibly experience (due to the absence of the anode 208) is loss of lithium inventory (LLI) (e.g., whereas, in a target cell of another anode metal material, the only possible failure mechanism experience is the loss of metal inventory (LMI)). Thus, the amount of metal (e.g., lithium) introduced in the electrolyte is the only limiting factor of the cell (e.g., the anode-free cell 210). Loss of lithium during formation and RPT cycles is considered the same as aging cycles (C/3). Also, because the material(s) of the current collector 212 are formulated or otherwise selected so that the anode-free cell 210 exhibits similar ionizing-metal consumption rates (e.g., Li consumption rates) as exhibited by the metal battery cell 202, testing the anode-free cell 210 and discerning its consumption rate yields the consumption rate for the metal battery cell 202. In other words, the anode-free cell 210 is tested under the following assumptions: 1) metal (e.g., Li) amount is the only limiting factor, 2) LMI (e.g., LLI) experienced on the current collector 212 (e.g., the Cu) is the same as would be experienced on the metal (e.g., Li) of the anode 208 (at least before metal (e.g., lithium) from the anode 208 itself is consumed), and 3) LMI (e.g., LLI) during formation and RPT cycles is considered the same as C/3 aging cycles (i.e., different C rates are not considered as a factor of the LMI (e.g., LLI)).

For most metal cells (e.g., for most Li metal cells), cell capacities have shown slight or no fade during testing of such cells, before a sudden decrease at the end of life. Therefore, the methods of this disclosure utilize a two-stage metal-consumption (e.g., lithium consumption) model. Since the anode 208 (e.g., the Li metal anode) of the metal battery cell 202 provides a source of excess metal (e.g., Li), the metal (e.g., the Li) loss per cycle may be expected to be dependent on the metal (e.g., the Li) inventory, wherein, during a first stage of the metal (e.g., lithium) consumption, the metal (e.g., Li) is at an excess amount and the metal (e.g., Li) loss per cycle rate is constant. Following the first stage, when the metal (e.g., the Li) has been substantially consumed from the anode 208, the amount of available, accessible metal (e.g., Li) is limited to the amount contained in the cathode 204. In this second stage, when the metal (e.g., the Li) is limited, the metal (e.g., the Li) loss per cycle (i.e., the consumption rate) follows an exponential consumption progression. Similarly, the consumption rate of the metal (e.g., Li) from the cathode 204 on the current collector 212 of the anode-free cell 210 follows the exponential consumption progression, such that discerning the metal consumption rate of the anode-free cell 210 provides the metal (e.g., Li) consumption rate for the metal battery cell 202, without having to directly test or damagingly disassemble the metal battery cell 202.

The cycle life of the first stage (also referred to herein as "stage 1") of operation of the metal battery cell 202 is determined (e.g., predicted) based on a measured thickness of the metal (e.g., Li) anode 208 of the metal battery cell 202 and on the consumption rate discerned through testing the anode-free cell 210. The cycle life of the second stage is determined (e.g., predicted) based on a measured initial cell capacity (e.g., Li (or other cathode metal) content in the cathode 204) and based on the consumption rate discerned through testing the anode-free cell 210. The total cycle life of the metal battery cell 202 is determined as a sum of the predicted cycle life of stage 1 and the predicted cycle life of stage 2.

Figure 8A:
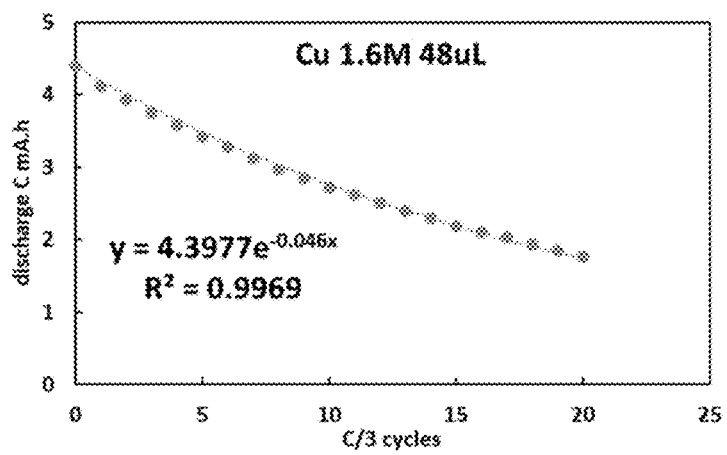
FIGS. 8A through 8C show the capacity decrease of Cu∥NMC coin cells during C/3 cycles.
Figure 8B:
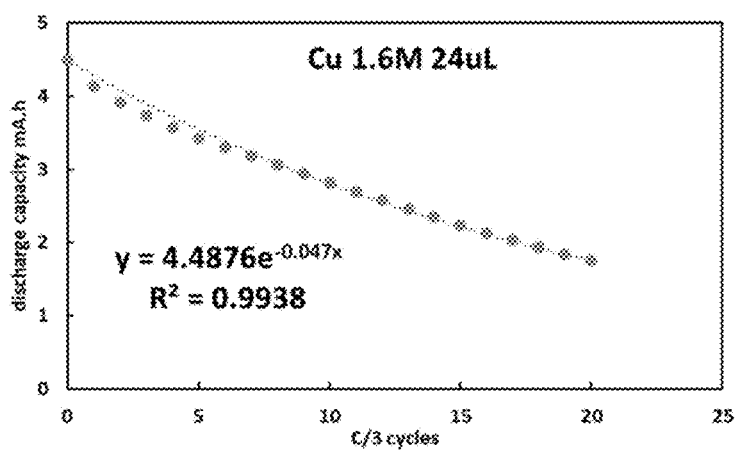
Figure 8C:
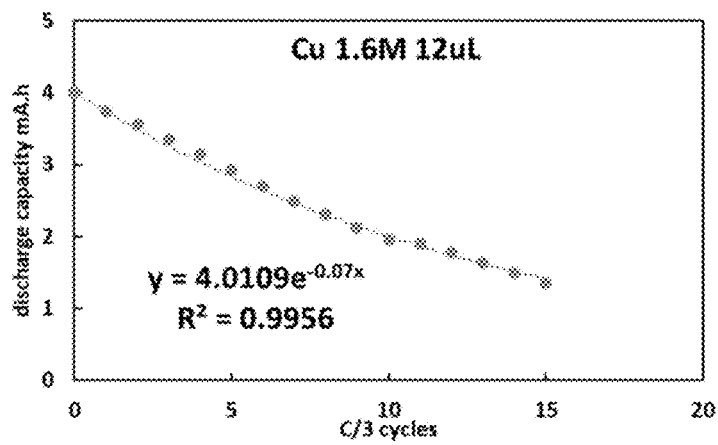

For example, the anode-free cell 210 described in the examples above was tested to monitor and track discharge capacity over a number of cycles, namely, fewer than about twenty-five cycles. Methods for measuring discharge capacity are known in the art and so need not be described in detail here. With these measured discharge capacities, a discharge capacity profile was prepared, and discharge capacity curves were fit to the profiles. More particularly, Equation 1 (below) was used to exponentially fit discharge capacity curves of the Cu‖NMC cell (anode-free cell 210), as shown in FIG. 8A, FIG. 8B, and FIG. 8C for different electrolyte levels (flooded per FIG. 8A, moderate per FIG. 8B, and lean per FIG. 8C):

$$y = B * e^{-Ax} \quad \text{(EQUATION 1)}$$

wherein:
B indicates the initial cell capacity starting from the first C/3 aging cycle; and
$e^{-A}$ indicates the capacity retention per cycle (hereinafter "CRPC") (such that 1−CRPC would indicate the capacity loss per cycle).

The B value is discernable from exponentially fitting the discharge capacity curves to the monitored and tracked discharge capacities. For example, in FIG. 8A, from the exponentially fit curve, the discharge capacity curve provides a B value of 4.3977. Likewise, the capacity retention per cycle (CRPC) is discernable from exponentially fitting the discharge capacity curves to the monitored and tracked discharge capacities. For example, in FIG. 8A, the discernable A value is 0.046; therefore, the capacity retention per cycle (CRPCP) of $e^{-A}$ is 0.955 (i.e., $e^{-0.046}$) (i.e., a capacity retention per cycle (CRPC) of 95.5%). Correspondingly, then, the capacity loss per cycle is discernable as 0.045 (i.e., 1−0.955) (i.e., a capacity loss per cycle of 4.5%).

While the present example applies an exponential curve fit to the discharge capacity data to discern the mathematical relationship between the observed discharge capacity across various cycles of the anode-free cell 210 and the cell's capacity retention per cycle (and/or capacity loss per cycle), in other embodiments, the curve fitting may apply a power law function, a sigmoid function, an exponential function, a square root function, a logarithmic function, combinations of any of the foregoing functions, and/or one or more of the foregoing functions in combination with a linear function or linear component. Applying any of such functions, at least one of the capacity retention per cycle and the capacity loss per cycle is discernable from the fitted curve, and the other of the capacity retention per cycle and the capacity loss per cycle is discernable as being one less the first discerned value. Accordingly, while by the present example in which the capacity retention per cycle was determined by a curve fit by an exponential function, such as that the capacity retention per cycle (CRPR) is represented by $e^{-A}$, in other embodiments, the CRPR may be represented by other variables, which may not be base e.

Because the material(s) of the current collector 212 (e.g., the copper of this example) was selected so that the anode-free cell 210 exhibits a substantially same target metal (e.g., Li) consumption rate as that of the target metal battery cell 202 (including the anode 208), the discerned capacity retention per cycle (CRPR) for the current collector 212 of the anode-free cell 210 provides the capacity retention per cycle (CRPR) for the anode 208 of the metal battery cell 202, which may be further converted to the metal consumption rate. However, because the target metal (e.g., the Li) in the metal battery cell 202 is in excess during stage 1, the metal consumption rate remains the same value until its thickness (in the anode 208) is depleted.

The target metal battery cell 202 (e.g., the Li∥NMC cell) was evaluated to determine its starting cell capacity. For example, the same technique used to determine the discharge capacities, over several cycles, for the discharge capacity profiles for the anode-free cell 210 may be used, before any cycles, to determine the initial discharge capacity (the RPT 0 discharge capacity) of the metal battery cell 202. For example, just as B (for Equation 1, above) indicated the initial cell capacity starting from the first C/3 aging cycle of the anode-free cell 210, C (for equation 2) would be the initial cell capacity starting from a first C/3 aging cycle of the metal battery cell 202.

Based on the measured initial Li∥NMC cell capacity and based on the capacity retention per cycle (CRPR) discerned from testing the anode-free cell 210 over several cycles, the thickness of Li (or other metal) lost per cycle can be determined, using Equation 2 (below):

$$H=C*(1-CRPR)*M*10/(F*d*s) \quad \text{(EQUATION 2)}$$

wherein:
H is the thickness of Li (or other metal) lost per cycle, in units of μm/cycle;

C is the initial discharge capacity of the metal battery cell 202 (e.g., of the Li∥NMC cell at RPT 0, or the formation capacity if the RPT test is eliminated), in unit of mA·h;

CRPR is the capacity retention per cycle discerned from testing of the anode-free cell 210 (e.g., the $e^{-A}$ of the exponentially fit curve providing Equation 1, above), in units of μm/cycle;

M is the Li (or other metal) molar mass, in units of g/mol (e.g., 6.941 g/mol for Li of this example);

F is Faraday's constant 26.801 A·h/mol;

d is the density of the Li (or other metal), in units of g/cm³ (e.g., 0.534 g/cm³ for Li of this example);

s is the surface area of the cathode 204, in units of cm², which can be measured directly from the cathode 204 (e.g., 1.266 cm² for this example); and the 10 is for unit conversion.

Accordingly, from the discerned (or otherwise provided) initial discharge capacity of the metal battery cell 202 in conjunction with the capacity retention rate discerned from testing the anode-free cell 210—in addition to other known constants and measurable or known physical properties of the anode 208 and the cathode 204 (i.e., the projected surface area of the cathode 204 (s), the Li (or other metal) density (d), the molar mass of the Li (or other metal) (M), and Faraday's constant (F)), the Li (or other metal) thickness lost per cycle (H) is determined.

Based on the determined thickness lost per cycle (H), the number of cycles defining the "life" of the anode 208 (and therefore the metal battery cell 202) in stage 1 is predicted using Equation 3 (below):

$$\text{Life}_1 = T_A/H \quad \text{(EQUATION 3)}$$

wherein:
$\text{Life}_1$ is the predicted life of the anode 208 (and therefore the metal battery cell 202) over stage 1, in terms of number of cycles for stage 1;

$T_A$ is a measured (or projected) thickness of the anode 208, in units of μm; and H is the thickness lost per cycle, in units of μm/cycle, calculated from Equation 2, as discussed above.

To predict the life (i.e., cycle life) of the metal battery cell 202 over the second stage (stage 2), the capacity retention per cycle (CRPC), discerned from testing the anode-free cell 210 over several cycles, is again used. That is, the Li∥NMC cell (the metal battery cell 202) is similar to the Cu∥NMC cell (the anode-free cell 210) in that the metal (e.g., Li) loss per cycle of the metal battery cell 202 is exponential, just as it was in the Cu∥NMC cell (the anode-free cell 210). This is because, when the target metal (e.g., Li) is effectively absent from the anode 208 of the metal battery cell 202 (e.g., when the target metal, such as lithium, is no longer active), the metal battery cell 202 is functionally similar to the anode-free cell 210 because the target metal (e.g., Li) on the anode 208 of the metal battery cell 202 has been completely lost in the form of SEI and dead metal (e.g., dead Li).

For this portion of the method, a final capacity (FC) percentage is designated as indicating the lifetime of the metal battery cell 202. In some embodiments, the FC percentage may be defined as ranging from 80% to 20%. For example, in some embodiments, when the cell capacity is reduced to 20% of the original cell capacity (e.g., when the discharge capacity at the third formation cycle is 20% of the original cell capacity), the cell may be considered "dead" (i.e., at the end of its cycle life). As another example, in some embodiments, when the cell capacity is reduced to 40% of the original cell capacity (e.g., when the discharge capacity at the third formation cycle is 40% of the original cell capacity), the cell may be considered "dead." The relationship between the final capacity (FC) percentage and the capacity retention per cycle (CRPC) is shown in Equation 4 (below):

$$FC = e^{-Ax} \quad \text{(EQUATION 4)}$$

wherein:
FC is the final capacity percentage;
$e^{-A}$ is the capacity retention per cycle (CRPC) discerned from testing the anode-free cell 210 and applying the exponentially fit curve; and
x is the number of cycles that define the life of the anode 208 (and therefore the metal battery cell 202) over stage 2.

As with Equation 1 above, Equation 4 may be adjusted based on the function(s) applied for discerning the mathematical relationship between observed discharge capacity behavior of the anode-free cell 210 and the cell's capacity retention (or loss) per cycle. For example, should a linear relationship be observed between the discharge capacity behavior of the anode-free cell 210 and the cell's CRPC, then Equation 4 of that embodiment may be otherwise presented as FC=(CRPC)x.

Therefore, with the defined final capacity (FC) percentage and the capacity retention per cycle (CRPC) discerned from testing the anode-free cell 210, the number of cycles defining the "life" of the anode 208 (and therefore the metal battery cell 202) in stage 2 is predicted by solving or "x" of Equation 4. With regard to the present example in which the exponential function was applied for fitting the discharge capacity curve, "x"—or, in other words, the "life" of the second stage ("Life$_2$") may be discerned using Equation 5 (below):

$$Life_2 = \ln(FC)/\ln(e^{-A}) \quad \text{(EQUATION 5)}$$

wherein:
Life$_2$ is the predicted life of the anode 208 (and therefore the metal battery cell 202) over stage 2, in terms of number of cycles for stage 2 (and Life$_2$=x from Equation 4);
FC is the final capacity percentage, as designated; and
$e^{-A}$ is the capacity retention per cycle (CRPC), discerned from testing the anode-free cell 210, as discussed above.

As with equations 1 and 4 above, Equation 5 may be adjusted based on the function(s) applied for discerning the mathematical relationship between observed discharge capacity behavior of the anode-free cell 210 and the cell's capacity retention (or loss) per cycle. For example, should a linear relationship be observed between the discharge capacity behavior of the anode-free cell 210 and the cell's CRPC, then Equation 5 of that embodiment may be otherwise presented as Life$_2$=FC/(CRPC).

The total predicted life of the anode 208 (and therefore the metal battery cell 202) is determined by summing the predicted life from the first stage (i.e., Life$_1$) and the predicted life from the second stage (i.e., Life$_2$) as shown in Equation 6 (below):

$$Life_{total} = Life_1 + Life_2 \quad \text{(EQUATION 6)}$$

Applying the above-described lifetime prediction methods to a particular example, for purposes of illustration, discharge capacity profiles for the above-described Cu∥NMC cells (anode-free cells 210) under different electrolyte conditions (flooded with 48 µL, moderate with 24 µL, and lean with 12 µL, each of the foregoing being at an electrolyte concentration of 1.6M) are shown in FIG. 8A, FIG. 8B, and FIG. 8C, respectively. Discharge capacity curves were exponentially fitted, providing the curves of y=4.3977e$^{-0.046x}$ in FIG. 8A, y=4.4876e$^{-0.047x}$ in FIG. 8B, and y=4.0109e$^{-0.07x}$ in FIG. 8C.

The three conditions showed similar B values (i.e., 4.3977 in FIG. 8A, 4.4876 in FIG. 8B, and 4.0109 in FIG. 8C), indicating the electrolyte volume did not significantly affect the initial cell capacity of the anode-free cells 210. The flooded (FIG. 8A) and the moderate (FIG. 8B) electrolyte cells had the same A value of about 0.046, meaning that, on average, e$^{-0.046}$=95.5% of Li was retained (e.g., in the electrolyte) for each cycle, providing a CRPC of 0.955. With 95.5% of the Li being retained each cycle, it follows that about 4.5% of Li metal was lost per cycle. The lean electrolyte cell (FIG. 8C) had a higher A value of 0.07, suggesting the lean electrolyte condition accelerates the Li loss process. Accordingly, in this and other embodiments, the capacity retention per cycle (CRPC) and/or the capacity loss per cycle may be discerned from observed discharge capacity behavior of the anode-free cell 210 over relatively few cycles (e.g., fewer than about 100 cycles, fewer than about 50 cycles, fewer than about 30 cycles) with a flooded or moderate electrolyte concentration and, in at least some embodiments, a sufficient or excess volume of electrolyte in the anode-free cell 210.

If a 40% final capacity percentage (FC) is used as the criteria for determining the lifetime, then the estimated lifetime of Li∥NMC cells (metal battery cells 202) under flooded electrolyte conditions is calculated, according to the methods of the disclosure, as shown in Table 2, below:

TABLE 2

PREDICTED COIN CELL LIFETIME USING 47 µm THICK Li METAL UNDER FLOODED ELECTROLYTE CONCENTRATIONS

|  | 1.6M LiPF$_6$ flooded |
|---|---|
| Li∥NMC discharge capacity at RPT0 (i.e., C for Equation 2) | 5.5 mA · h |
| Li Loss/cycle (excess) (i.e., H calculated from Equation 2) | 0.90 µm |
| Measured (or projected) thickness of the anode (i.e., T$_A$ for Equation 3) | 47 µm |
| Predicted cycle (excess) (i.e., Life$_1$, calculated from Equation 3) | 52 |
| Li Loss/cycle (limited) (i.e., 1 – e$^{-A}$, discerned from testing the anode-free cell, i.e., 1 – CRPC) | 4.3% |
| Predicted cycle (limited)* (i.e., Life$_2$, calculated from Equation 5) | 20 |
| Estimated total lifetime (i.e., Life$_{total}$, calculated from Equation 6) | 72 cycles |

*FC percentage designated as 40%

The estimated lifetime of Li∥NMC cells (metal battery cells 202) are much longer than the lifetime shown in FIG. 6B. This is because the electrolyte used in the Li∥NMC cell (metal battery cell 202) for forming the capacity profile of FIG. 6B was an electrolyte not designed for long cycle life; therefore, the cells (metal battery cells 202) associated with FIG. 6B died due to the ED, rather than LMI. In other words, in the design of the Li∥NMC cell (metal battery cell 202) evaluated for FIG. 6B, the limiting factors were both ED and LMI (namely, LLI in this case). It is completed that, addressing the ED of such cell, such as by providing more electrolyte initially in the metal battery cell 202, LMI would become the only limiting factor, and an observed lifetime of the metal battery cell 202 would more closely match that predicted in Table 2 above.

Experimental Validation of the Methods of the Disclosure

In order to validate the effectiveness of the methods of embodiments of the disclosure, and to minimize the effect of electrolyte depletion (ED) as a factor on cell life, more Li∥NMC cells (metal battery cells 202) were tested under the same conditions as in the experimental example discussed above, with the only difference being that the cells (metal battery cells 202) were all in flooded electrolyte condition, and refill of electrolyte was performed when ED happened. The cells (metal battery cells 202), upon initially "dying" were opened up, and more electrolyte (of the separator and electrolyte 206) was added. The actual cell lifetime was compared with the predicted lifetime ($Life_{total}$) from Table 2. The cell failure mechanisms were diagnosed using the methods discussed above to ensure that the cause for failure of the cells (metal battery cells 202) was LMI (i.e., LLI in this case), and not the ED or the ICI failure mechanism.

Figure 9A:
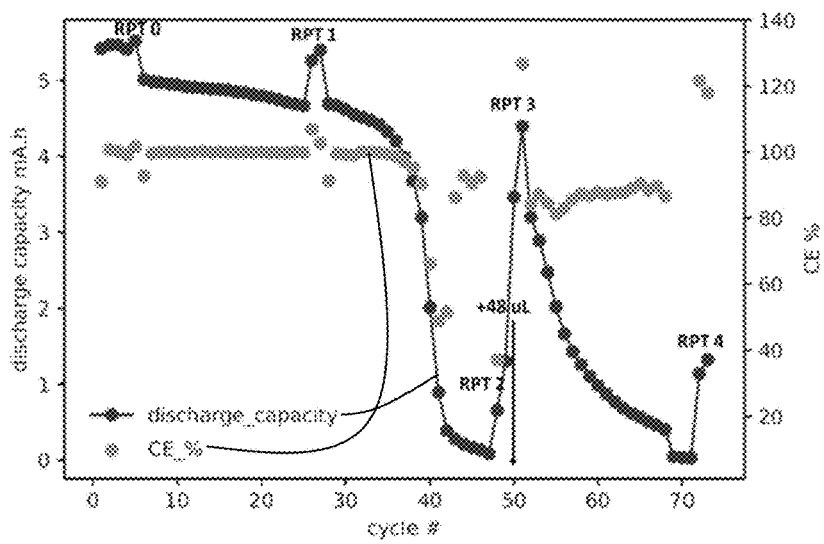
FIGS. 9A through 9C show the cycle life of Li‖NMC cell (47 μm-thick) (FIG. 9A), the incremental capacity curves for RPT cycles (FIG. 9B), and a corresponding rest voltage profile for C/3 cycles (FIG. 9C).
Figure 9B:
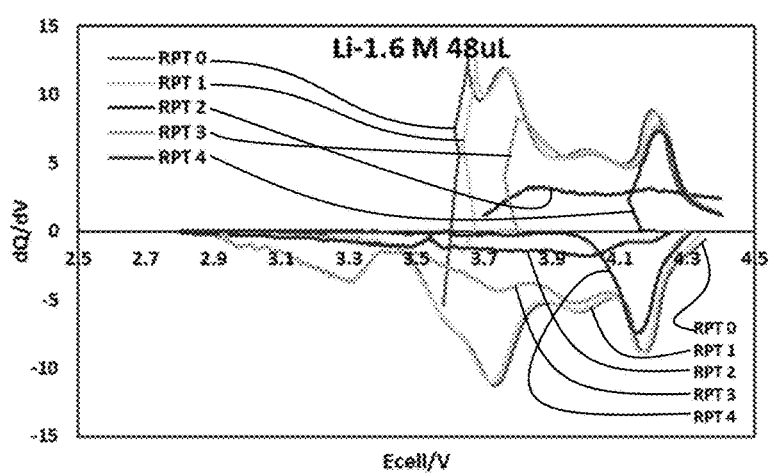
Figure 9C:
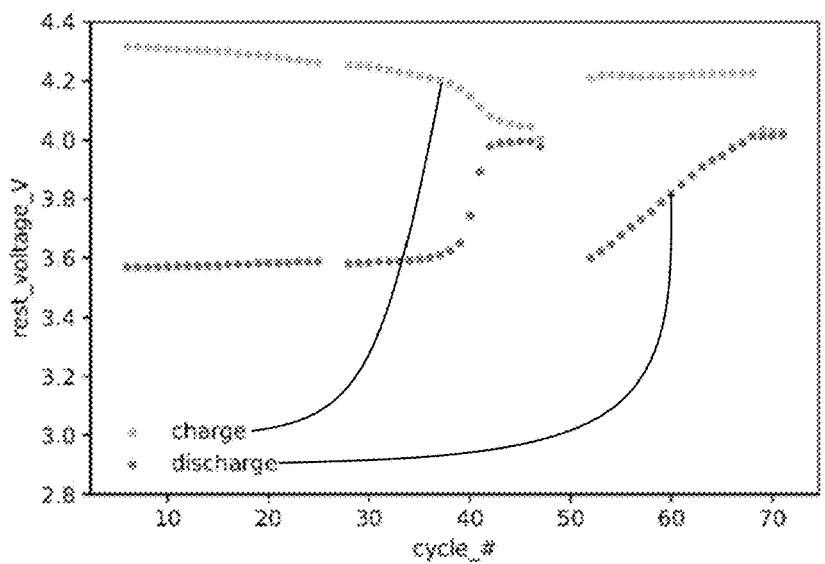

FIG. 9A through FIG. 9C show the cycle life of the Li∥NMC cell (47 µm-thick) (by discharge capacity profile of FIG. 9A), the incremental capacity curves for RPT cycles (in FIG. 9B), and its corresponding rest voltage profile for C/3 cycles (FIG. 9C).

In FIG. 9C, the 1.6M Li∥NMC cell (metal battery cell 202) first showed a failure mechanism of electrolyte depletion starting from cycle 40. After adding 48 µL of electrolyte on cycle 50, the cell capacity recovered before another decrease. From comparison of the rest voltage profile of FIG. 7C, which indicates electrolyte depletion, it is clear from FIG. 9C that the metal battery cell 202 experienced a failure mechanism of ED between about cycle 35 and cycle 50. On the other hand, from comparison of the rest voltage profile of FIG. 7B, which indicates loss of lithium (or other metal) inventory, it is clear from FIG. 9C that the metal battery cell 202 experienced a failure mechanism of loss of lithium inventory (LMI) between about cycle 50 and cycle 70. Thus, by testing the metal battery cell 202 and tracking and monitoring the rest voltage quickly diagnosed, in fewer than about 100 cycles, two separate failure mechanisms were observed and diagnosed.

To confirm the validity of the method of diagnosing the failure mechanisms through rest voltage monitoring, the metal battery cell 202 was also evaluated to provide dQ/dV curves (FIG. 9B). The dQ/dV curves (FIG. 9B) confirmed the two failure mechanisms. More particularly, RPT 2 of FIG. 9B shows reduced intensities for all three peaks, indicating the ED failure mechanism. RPT 3 showed recovered peak intensities after adding more electrolyte, similar to FIG. 5B, further confirming the electrolyte depletion (ED) was the failure mechanism of cycles 35 to 50. The RPT 4 (of FIG. 9B) showed only one peak on the charge and discharge process, showing a sign of LMI similar to FIG. 4B.

Accordingly, the dQ/dV curves (FIG. 9B) confirmed the accuracy of the disclosed method of diagnosing the failure mechanism, i.e., diagnosing the failure mechanisms by monitoring and tracking rest voltage.

For a detailed validation on the disclosed methods of predicting cell lifetime, the stage 1 of the Li∥NMC cell (metal battery cell 202) was calculated to be 52 cycles (i.e., $Life_1$ from Table 2), which is higher than the actual performance of 35 cycles (from FIG. 9C). The Li loss during formations and RPT cycles can be one of the possible reasons for the discrepancy, which was not considered different from the C/3 aging cycles in the disclosed method of predicting cell lifetime. Other reasons for the discrepancy may include the gradual shift of the electrolyte concentration during the continuous solvent consumption, which may change the composition of SEI and the ohmic resistance of the electrolyte. The cell recovery process after cycle 50 (see FIG. 9C) may also result in mechanic disruption that reduces the cycle life of stage 1 ($Life_1$). During the stage 2, the actual life was 18 cycles (cycle 50 to 68 of FIG. 9C), which is shorter than but close to the predicted cycle life ($Life_2$ of Table 2) of 20 cycles. This difference is because of the cell impedance buildup during the operation of the Li∥NMC cell, the actual capacity fade being quicker compared to a capacity fade of a fresh, flat Cu surface and a fresh cathode without CEI.

Figure 10A:
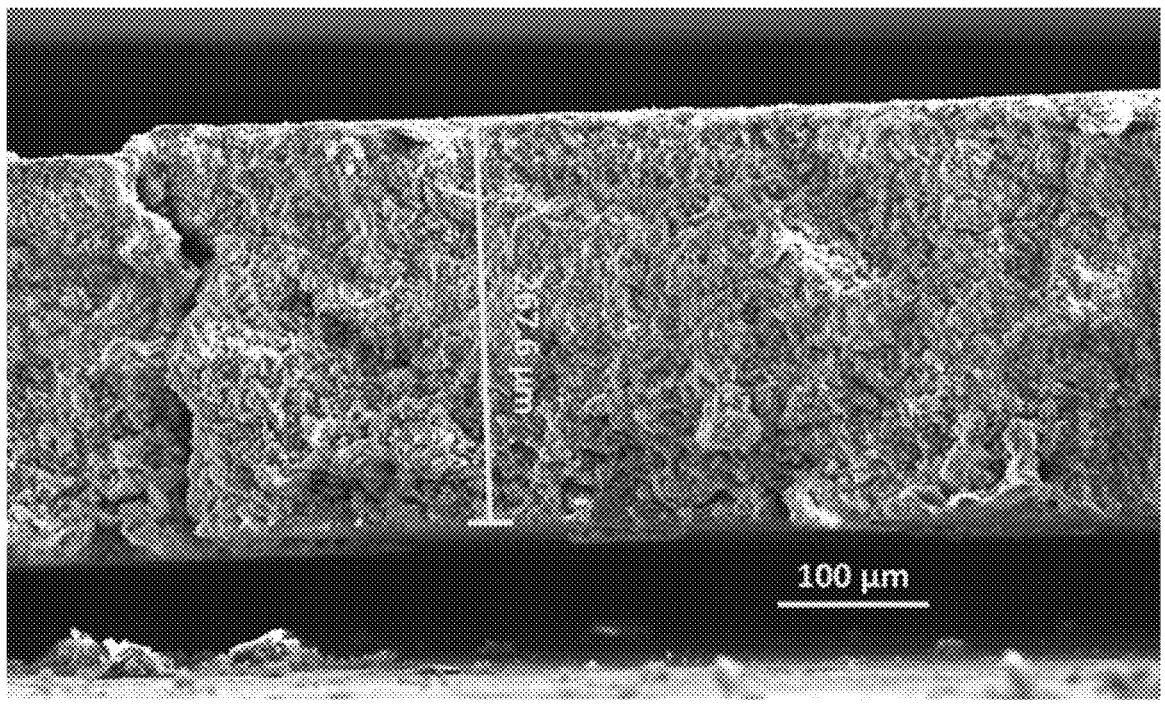
FIGS. 10A and 10B show scanning electron microscope (SEM) images of anodes from metal battery cells that died due to loss of Li inventory (LLI) (FIG. 10A) or electrolyte depletion (ED) (FIG. 10B).
Figure 10B:
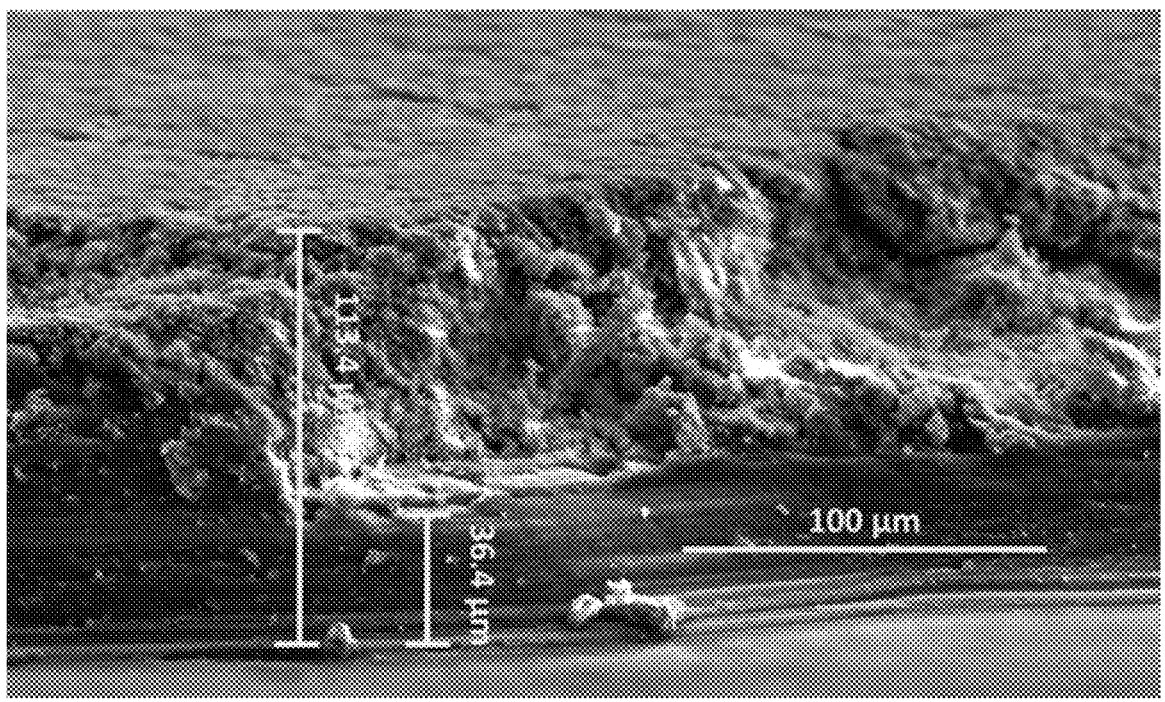

The Li metal anode samples (e.g., anode 208) were collected for scanning electron microscopy from cells (metal battery cell 202) that died due to LLI and ED. The original Li metal thickness (of the anode 208) was 47 µm. FIG. 10A shows an anode (e.g., anode 208) from a cell that died due to LLI, showing that all the Li metal turned into porous SEI and dead Li with a total thickness of 267.6 µm. In FIG. 10B, shows an anode (e.g., anode 208) from a cell that died due to ED, showing that the upper part (77 µm) of the Li metal anode, which upper part is adjacent the electrolyte, turned into a porous structure but the bottom part (36.4 µm) of the Li metal anode remained fresh.

The above-discussed experimental results showed a good match with the lifetime prediction determined by the methods disclosed, with the actual cell lifetime (measured directly from the target metal-based cell battery, for validation of the lifetime prediction) being slightly shorter than the predicted cell lifetime. This is because the disclosed lifetime prediction method predicts the maximum lifetime of a cell under ideal conditions. However, in real operation, the cell may suffer from different failure mechanisms, and the buildup of Li∥NMC cell impedance overtime may also reduce the cell capacity. Even with some difference between the predicted lifetime, using the disclosed methods, and the actual cell lifetime (determined by direct testing of the target metal battery cell 202), the disclosed methods enable fast, simple, non-destructive, and safe screening/evaluation of potential electrolyte candidates, artificial SEIs, or other components or materials of the metal battery cell 202. The methods also enable fast, simple, and safe cell lifetime predictions. Together, the methods for fast diagnosis of failure mechanisms and for lifetime prediction enable efficient cell design to balance specific energy and cycle life.

Additional experiment- and model-based confirmations of the failure mechanism diagnostic and lifetime prediction methods of embodiments of the present disclosure are reflected in Gao et al., "Fast Diagnosis of Failure Mechanisms and Lifetime Prediction of Li Metal Batteries," *Small Methods*, Wiley-VCH GmbH, 2020, 11 pages, the entirety of which is hereby incorporated herein by this reference.

Conclusion

Accordingly, as discussed above, different cell failure mechanisms—using Li metal and anode-free cells—were quantitatively analyzed. By the disclosed methods, rest voltage profile and change of CE are used to perceive different failure mechanisms, which may enable early fault detection under different conditions. Moreover, the methods provide for quick (e.g., testing with fewer than about 100 cycles) maximum lifetime predictions for Li (or other) metal cells, via use of anode-free cells under ideal situations where the Li (or other) metal amount is the only limiting factor. The disclosed methods are usable as quick and non-damaging screening tools to pre-filter a large amount of artificial SEI candidates, and the methods have great potential to be used in areas that need high throughput experiments, such as electrolyte selection. The disclosed methods can also provide suggestions for balancing cell lifetime and energy density for a desired goal. And, while it is contemplated that the disclosed failure diagnosis methods may be useful for evaluating candidates (e.g., various electrolytes or other components of the metal battery cells 202) during battery design, in other embodiments, the disclosed failure diagnosis methods may be used during operation of already-designed batteries to quickly detect early failure, without the need for additional testing. Thus, the methods disclosed, both for diagnosing failure mechanisms and for predicting battery maximum lifetime, provide meaningful ways to accelerate the development and commercialization of Li metal batteries, or other metal-based batteries (e.g., sodium-based metal batteries; zinc-based metal batteries).

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method for analyzing operation of a metal-based battery cell, the method comprising:
   providing a metal-based battery cell comprising a cathode, an anode, and an electrolyte between the cathode and the anode;
   cycling the metal-based battery cell;
   measuring, over the cycling, a rest voltage and Coulombic efficiency (CE) of the metal-based battery cell, without conducting additional testing, to provide rest voltage and CE profiles indicating, by trends indicated therein, at least one of an increased cell impedance failure mechanism, a loss of metal inventory failure mechanism, or an electrolyte depletion failure mechanism;
   providing an anode-free battery cell comprising the cathode, a current collector, and the electrolyte between the cathode and the current collector, the anode-free battery cell not comprising the anode of the metal-based battery cell;
   cycling, over fewer than 100 cycles, the anode-free battery cell;
   measuring, over the fewer than 100 cycles, a discharge capacity of the anode-free battery cell;
   fitting a discharge capacity curve to the measured discharge capacity to discern a capacity retention per cycle of the anode-free battery cell; and
   based in part on the capacity retention per cycle discerned from the anode-free battery cell, and without measuring discharge capacities of the metal-based battery cell directly, predicting a cycle life of the metal-based battery cell.

2. The method of claim 1, wherein providing the metal-based battery cell comprises providing the metal-based battery cell with the anode, the anode comprising one or more of lithium (Li), sodium (Na), zinc (Zn), potassium (K), palladium (Pd), iron (Fe), magnesium (Mg), calcium (Ca), strontium (Sr), barium (Ba), titanium (Ti), cobalt (Co), nickel (Ni), copper (Cu), silver (Ag), indium (In), aluminum (Al), gallium (Ga), tin (Sn), lead (Pb), bismuth (Bi), alloys thereof, or other combinations thereof.

3. The method of claim 1, wherein providing the anode-free battery cell comprises providing the anode-free battery cell with the current collector, the current collector comprising at least one metal having a higher plating potential than a metal of the anode of the metal-based battery cell.

4. The method of claim 3, wherein providing the anode-free battery cell with the current collector comprises providing a current collector comprising one or more of copper (Cu), steel, aluminum (Al), and carbon (C).

5. The method of claim 1, wherein providing the metal-based battery cell and providing the anode-free battery cell comprise providing the electrolyte at a level of at least about 10 g of electrolyte per Amp-hour.

6. The method of claim 1, wherein providing the metal-based battery cell and providing the anode-free battery cell comprise providing the electrolyte at a level of between about 3 g of electrolyte per Amp-hour and about 10 g of electrolyte per Amp-hour.

7. The method of claim 1, wherein providing the metal-based battery cell and providing the anode-free battery cell comprise providing the electrolyte at a level of about 3 g of electrolyte per Amp-hour or fewer.

8. The method of claim 1, wherein providing the anode-free battery cell comprises removing the anode from the metal-based battery cell and providing the current collector in place of the anode.

9. The method of claim 1, wherein:
   cycling, over the fewer than 100 cycles, the anode-free battery cell comprises cycling the anode-free battery cell over fewer than about 50 cycles; and
   measuring, over the fewer than 100 cycles, the discharge capacity of the anode-free battery cell comprises measuring the discharge capacity over the fewer than about 50 cycles.

10. A system for diagnosing failure mechanisms and for predicting a cycle life of a metal-based battery cell, the system comprising:
    a metal-based battery cell comprising a cathode, an anode, and an electrolyte between the cathode and the anode; and
    an anode-free cell comprising another of the cathode, a current collector, and another of the electrolyte between the cathode and the current collector,
    the anode comprising a metal, and
    the current collector of the anode-free cell comprising another metal different from the metal of the anode of the metal-based battery cell.

11. The system of claim 10, wherein the metal-based battery cell and the anode-free cell are configured as coin cells.

12. The system of claim 10, wherein the cathode comprises a metal material comprising at least one of a metal oxide material, a metal phosphate material, a sulfur-based metal material, or an organic material.

13. The system of claim 10, wherein the anode comprises lithium (Li), sodium (Na), zinc (Zn), potassium (K), palladium (Pd), iron (Fe), magnesium (Mg), calcium (Ca), strontium (Sr), barium (Ba), titanium (Ti), cobalt (Co), nickel (Ni), copper (Cu), silver (Ag), indium (In), aluminum (Al), gallium (Ga), tin (Sn), lead (Pb), bismuth (Bi), or combinations thereof.

14. The system of claim 10, wherein the current collector comprises copper (Cu), steel, aluminum (Al), carbon (C), or combinations thereof.

15. The system of claim 10, wherein:
    the anode comprises lithium; and
    the current collector comprises copper.

16. The system of claim 10, wherein the anode-free cell, prior to operation, comprises no lithium in its current collector.

17. The system of claim 10, wherein:
the metal-based battery cell further comprises a separator within the electrolyte; and
the anode-free cell further comprises another of the separator within the electrolyte.

18. The system of claim 10, wherein:
the metal-based battery cell further comprises a solid electrolyte with target metal ion conduction; and
the anode-free cell further comprises another of the solid electrolyte with target metal ion conduction.

19. A system for diagnosing failure mechanisms and for predicting a cycle life of a metal-based battery cell, the system comprising:
at least one battery cell comprising:
a cathode;
an electrolyte; and
either an anode or a current collector, the anode being selectively removable to replace the anode with the current collector, and the current collector being selectively removable to replace the current collector with the anode.

20. The system of claim 19, wherein the electrolyte comprises a solid state electrolyte or a gel state electrolyte.

* * * * *